United States Patent

Im

(12)

(10) Patent No.: US 6,961,117 B2
(45) Date of Patent: Nov. 1, 2005

(54) PROCESS AND MASK PROJECTION SYSTEM FOR LASER CRYSTALLIZATION PROCESSING OF SEMICONDUCTOR FILM REGIONS ON A SUBSTRATE

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 10/432,485

(22) PCT Filed: Nov. 27, 2001

(86) PCT No.: PCT/US01/44415

§ 371 (c)(1),
(2), (4) Date: Oct. 20, 2003

(87) PCT Pub. No.: WO02/42847

PCT Pub. Date: May 30, 2002

(65) Prior Publication Data

US 2004/0061843 A1 Apr. 1, 2004

Related U.S. Application Data

(60) Provisional application No. 60/253,256, filed on Nov. 27, 2000.

(51) Int. Cl.[7] .......................... G03B 27/54; G03B 27/42
(52) U.S. Cl. .......................................... 355/67; 355/53
(58) Field of Search .............................. 355/53, 67–71, 355/77; 250/492.2, 548; 356/399–401

(56) References Cited

U.S. PATENT DOCUMENTS

| 3,632,205 A | | 1/1972 | Marcy |
| 4,234,358 A | | 11/1980 | Celler et al. |
| 4,309,225 A | | 1/1982 | Fan et al. |
| 4,382,658 A | | 5/1983 | Shields et al. |
| 4,456,371 A | * | 6/1984 | Lin .............................. 355/71 |

(Continued)

FOREIGN PATENT DOCUMENTS

| EP | 681316 | 8/1995 |
| EP | 655774 | 7/1996 |
| EP | 1067593 | 10/2001 |
| GB | 2338342 | 12/1999 |
| GB | 2338343 | 12/1999 |

(Continued)

OTHER PUBLICATIONS

U.S. Provisional Appl. No. 60/253,256, Im, filed Aug. 31, 2003.
U.S. Appl. No. 2003/096489, Im et al., filed May 22, 2003.
U.S. Appl. No. 2003/119286, Im et al., filed Jun. 26, 2003.
U.S. Appl. No. 2005/032249, Im et al., filed Feb. 10, 2005.
U.S. Appl. No. 2003/029212, Im, filed Feb. 13, 2003.
U.S. Appl. No. 2004/061843, Im, filed Apr. 1, 2004.
U.S. Appl. No. 2005/034653, Im et al., filed Feb. 17, 2005.
Im et al., "Controlled Super–Lateral Growth of Si Films for Microstructural Manipulation and Optimization", Phys. Stat. Sol. (a), vol. 166, p. 603 (1998).

(Continued)

*Primary Examiner*—Henry Hung Nguyen
(74) *Attorney, Agent, or Firm*—Baker Botts LLP

(57) ABSTRACT

A process and system for processing a silicon thin film on a sample are provided. In particular, an irradiation beam generator is controlled to emit irradiation beam pulses at a predetermined repetition rate. These irradiation beam pulses are then separated into a first set of beam pulses and a second set of beam pulses. The first set of beam pulses are caused to irradiate through a mask to produce a plurality of beamlets. The second set of beam pulses and the beamlets are caused to impinge and irradiate at least one section of the silicon thin film. When the second set of beam pulses and the beamlets simultaneously irradiate the section of the silicon thin film, this combination of the beamlets and second set of beam pulses provides a combined intensity which is sufficient to melt the section of the silicon thin film throughout an entire thickness of the section.

58 Claims, 13 Drawing Sheets

U.S. PATENT DOCUMENTS

| | | | |
|---|---|---|---|
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A | 12/1988 | Liu | |
| 4,800,179 A | 1/1989 | Mukai | |
| 4,855,014 A | 8/1989 | Kakimoto et al. | |
| 4,870,031 A | 9/1989 | Sugahara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| RE33,836 E | 3/1992 | Resor, III et al. | |
| 5,145,808 A | 9/1992 | Sameshima et al. | |
| 5,204,659 A | 4/1993 | Sarma | |
| 5,233,207 A | 8/1993 | Anzai | |
| 5,285,236 A | 2/1994 | Jain | |
| 5,291,240 A | 3/1994 | Jain | |
| 5,304,357 A | 4/1994 | Sato et al. | |
| 5,373,803 A | 12/1994 | Noguchi et al. | |
| 5,395,481 A | 3/1995 | McCarthy | |
| 5,409,867 A | 4/1995 | Asano | |
| 5,453,594 A | 8/1995 | Konecny | |
| 5,456,763 A | 10/1995 | Kaschmitter et al. | |
| 5,496,768 A | 3/1996 | Kudo | |
| 5,523,193 A | 6/1996 | Nelson | |
| 5,529,951 A | 6/1996 | Noguchi et al. | |
| 5,591,668 A | 1/1997 | Maegawa et al. | |
| 5,721,606 A * | 2/1998 | Jain | 355/53 |
| 5,742,426 A | 4/1998 | York | |
| 5,756,364 A | 5/1998 | Tanaka et al. | |
| 5,766,989 A | 6/1998 | Maegawa et al. | |
| 5,844,588 A | 12/1998 | Anderson | |
| 5,861,991 A | 1/1999 | Fork | |
| 5,893,990 A | 4/1999 | Tanaka | |
| 5,986,807 A | 11/1999 | Fork | |
| 6,014,944 A | 1/2000 | Russell et al. | |
| 6,072,631 A | 6/2000 | Guenther et al. | |
| 6,081,381 A | 6/2000 | Shalapenok et al. | |
| 6,117,752 A | 9/2000 | Suzuki | |
| 6,120,976 A | 9/2000 | Treadwell et al. | |
| 6,130,009 A | 10/2000 | Smith et al. | |
| 6,130,455 A | 10/2000 | Yoshinouchi | |
| 6,156,997 A | 12/2000 | Yamazaki et al. | |
| 6,162,711 A | 12/2000 | Ma et al. | |
| 6,169,014 B1 | 1/2001 | McCulloch | |
| 6,172,820 B1 | 1/2001 | Kuwahara | |
| 6,177,301 B1 | 1/2001 | Jung | |
| 6,187,088 B1 | 2/2001 | Okumura | |
| 6,190,985 B1 | 2/2001 | Buynoski | |
| 6,193,796 B1 | 2/2001 | Yang | |
| 6,235,614 B1 | 2/2001 | Yang | |
| 6,203,952 B1 | 3/2001 | O'Brien et al. | |
| 6,242,291 B1 | 6/2001 | Kusumoto et al. | |
| 6,285,001 B1 | 9/2001 | Fleming et al. | |
| 6,300,175 B1 | 10/2001 | Moon | |
| 6,313,435 B1 | 11/2001 | Shoemaker et al. | |
| 6,316,338 B1 | 11/2001 | Jung | |
| 6,320,227 B1 | 11/2001 | Lee et al. | |
| 6,322,625 B2 | 11/2001 | Im | |
| 6,326,186 B1 | 12/2001 | Park et al. | |
| 6,326,286 B1 | 12/2001 | Park et al. | |
| 6,333,232 B1 | 12/2001 | Kunikiyo | |
| 6,368,945 B1 | 4/2002 | Im | |
| 6,388,146 B1 | 5/2002 | Onishi et al. | |
| 6,407,012 B1 | 6/2002 | Miyasaka et al. | |
| 6,444,506 B1 | 9/2002 | Kusumoto et al. | |
| 6,468,845 B1 | 10/2002 | Nakajima et al. | |
| 6,495,067 B1 | 12/2002 | Ono | |
| 6,511,718 B1 | 1/2003 | Paz de Araujo et al. | |
| 6,521,492 B2 | 2/2003 | Miyasaka et al. | |
| 6,526,585 B1 | 3/2003 | Hill | |
| 6,528,359 B2 | 3/2003 | Kusumoto et al. | |
| 6,555,449 B1 | 4/2003 | Im et al. | |
| 6,563,077 B2 | 5/2003 | Im | |
| 6,573,531 B1 * | 6/2003 | Im et al. | 257/45 |
| 6,582,827 B1 | 6/2003 | Im | |
| 6,621,044 B2 * | 9/2003 | Jain et al. | 219/121.7 |
| 6,635,554 B1 | 10/2003 | Im et al. | |
| 6,830,993 B1 | 12/2004 | Im et al. | |
| 2001/0001745 A1 | 5/2001 | Im et al. | |
| 2001/0041426 A1 | 11/2001 | Im | |
| 2002/0104750 A1 | 8/2002 | Ito | |
| 2003/0029212 A1 | 2/2003 | Im | |
| 2003/0096489 A1 | 5/2003 | Im et al. | |
| 2003/0119286 A1 | 6/2003 | Im et al. | |
| 2004/0053450 A1 | 3/2004 | ITO | |
| 2004/0061843 A1 | 4/2004 | Im | |
| 2005/0032249 A1 | 2/2005 | Im et al. | |
| 2005/0034653 A1 | 2/2005 | Im et al. | |

FOREIGN PATENT DOCUMENTS

| | | |
|---|---|---|
| GB | 2338597 | 12/1999 |
| JP | 62181419 | 8/1987 |
| JP | 2283036 | 11/1990 |
| JP | 04033327 | 2/1992 |
| JP | 6252048 | 9/1994 |
| JP | 6283422 | 10/1994 |
| JP | 7176757 | 7/1995 |
| JP | 11064883 | 3/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | 02031869 | 4/2002 |
| WO | 0242847 | 5/2002 |
| WO | 02086954 | 5/2002 |
| WO | 02086955 | 10/2002 |
| WO | 03018882 | 3/2003 |
| WO | 03046965 | 6/2003 |
| WO | 04075263 | 8/2003 |
| WO | 03084688 | 10/2003 |
| WO | 04017379 | 2/2004 |
| WO | 04017380 | 2/2004 |
| WO | 04017381 | 2/2004 |
| WO | 04017382 | 2/2004 |

OTHER PUBLICATIONS

S.D. Brotherton et al., "Influence of Melt Depth in Laser Crystallized Poly–Si Thin Film Transistors," 82 J. Appl. Phys. 4086 (1997).

J.S. Im et al., "Crystalline Si Films for Integrated Active–Matrix Liquid–Crystals Displays," 21 MRS Bulletin 39 (1996).

Im et al,. "Single–Crystal Si Films for Thin–Film Transistor Devices," Appl. Phys. Letts., vol. 70 (25), p. 3434 (1997).

Sposili et al., "Sequential Lateral Solidification of Thin Silicon Films on SiO2", Appl. Phys. Letts., vol. 69 (19), p. 2864 (1996).*

Crowder et al., "Low–Temperature Single–Crystal Si TFT's Fabricated on Si films processed via Sequential Lateral Solidification", IEEE Electron Device Letter, vol. 19 (8), p. 306 (1998).*

Sposili et al., "Single–Crystal Si Films via a Low–Substrate– Temperature Excimer–Laser Crystallization Method", Mat. Res. Soc. Symp. Proc. vol. 452, pp. 953–958, 1997 Materials Reasearch Society.*

C. E. Nebel, "Laser Interference Structuring of A–SI:h" Amorphous Silicon Technology—1996, San Francisco, CA Apr. 8–12, 1996, Materials Research Society Symposium Proceedings, vol. 420, Pittsburgh, PA.

J. H. Jeon et al., "Two–step laser recrystallization of poly–Si for effective control of grain boundaries", Journal of Non Crystalline Solids, North–Holland Publishing Company, NL, vol. 266–269, May 2000, pp. 645–649.

H. Endert et al., "Excimer Laser: A New Tool for Precision Micromaching," 27 Optical and Quantum Electronics, 1319 (1995).

"Overview of Beam Delivery Systems for Excimer Laser," Micro/Las Lasersystem GMBH.

K.H. Weiner et al., "Ultrashallow Junction Formation Using Projection Gas Immersion Laser Doping (PGILD)," A Verdant Technologies Technical Brief, Aug. 20, 1997.

Hau–Riege C.S. et al., "The Effects Microstructural Transitions at Width Transitions on interconnect reliabity," Journal of Applied Physics, Jun. 15, 2000, vol. 87, No. 12, pp. 8467–8472.

McWilliams et al., "Wafer–Scale Laser Pantography: Fabrication of N–Metal–Oxide–Semiconductor Transistors and Small–Scale Integrated Circuits By Direct–Write Laser–Induced Pyrolytic Reactions," Applied Physics Letters, American Institute of Physics, New York, US, vol. 43, No. 10, Nov. 1983, pp. 946–948.

Mariucci et al., "Grain boundary location control by patterned metal film in excimer laser crystallized polysilicon," Proceedings of the Figth Internation COnference on Polycrystalline Semiconductors, Schwabisch Gmund, Germany, Sep. 13–18, 1998, vol. 67–68, pp. 175–180.

Broadbent et al., "Excimer Laser Processing of Al–1%Cu/TiW Interconnect Layers," 1989 Proceedings, Sixth International IEEE VLSI Multilevel Interconnection COnference, Santa Clara, CA, Jun. 12–13, 1989, pp. 336–345.

H.J. Kim and James S. Im, "Grain Boundary Location–Controlled Poly–Si Films for TFT Devices Obtained Via Novel Excimer Laser Process," Abstracts for Symposium of Materials Research Society, Nov.27 to Dec. 2, 1994, p. 230.

S.D. Brotherton, "Polycrystalline Silicon Thin Film Transistors," 10 Semicond. Sci. Tech., pp. 721–738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491–98 (1994).

E. Fogarassy et al., "Pulsed Laser Crystallization of Hydrogen–Free a–Si Thin Films for High–Mobility Poly–Si TFT Fabrication," 56 Applied Physics A—Solids and Surfaces, pp. 365–373 (1993).

Y. Miyata et al,"Low–Temperature Polycrystalline Silicon Thin–Film Transistors for Large–Area Liquid Crystal Display," 31 Japanese J. of Applied Physics Part 1 —Regular Papers Short Notes & Review Papers, pp. 4559–4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser–Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". No date.

Ishida et al., "Ultra–shallow boxlike profiles fabricated by pulsed ultraviolet–laser doping process", J. Vac. Sci. Technol. B 12(1), pp. 399–403, 1994. (No month).

Yoshimoto, et al., "Excimer–Laser–Produced and Two–Dimensionally Position–Controlled Giant Si Grains on Organic SOG Underlayer", pp. 285–286, AM–LCD 2000. No month.

Ozawa et al., "Two–Dimensionally Position–Controlled Exicer–Laser–Crystallization of Silicon Thin Films on Glassy Substrate", Jpn. J. Appl. Phys. vol. 38, Part 1, No. 10, pp. 5700–5705, (1999). No month.

J.W. Boyd, Laser Processing of Thin Films and Microstructures, Oxidation, Deposition, and Etching of Insulators (Springer—Verlag Berlin Heidelber 1987).*

N. Yamamuchi and R. Reif, J. Appl. Phys 75 (1994) 3235.

T. Noguchi, Jpn. Appl. Phys. 32 (1993) L1585.

Ishihara et al., "A Novel Double–Pulse Exicem–Laser Crystallization Method of Silicon Thin–Films," Japanese Journal of Applied Physics, Publication Office Japanes Journal of Applied Physics, Tokyo, Japan, vol. 34, No. 8A, Aug. 1995, pp. 3976–3981.

* cited by examiner

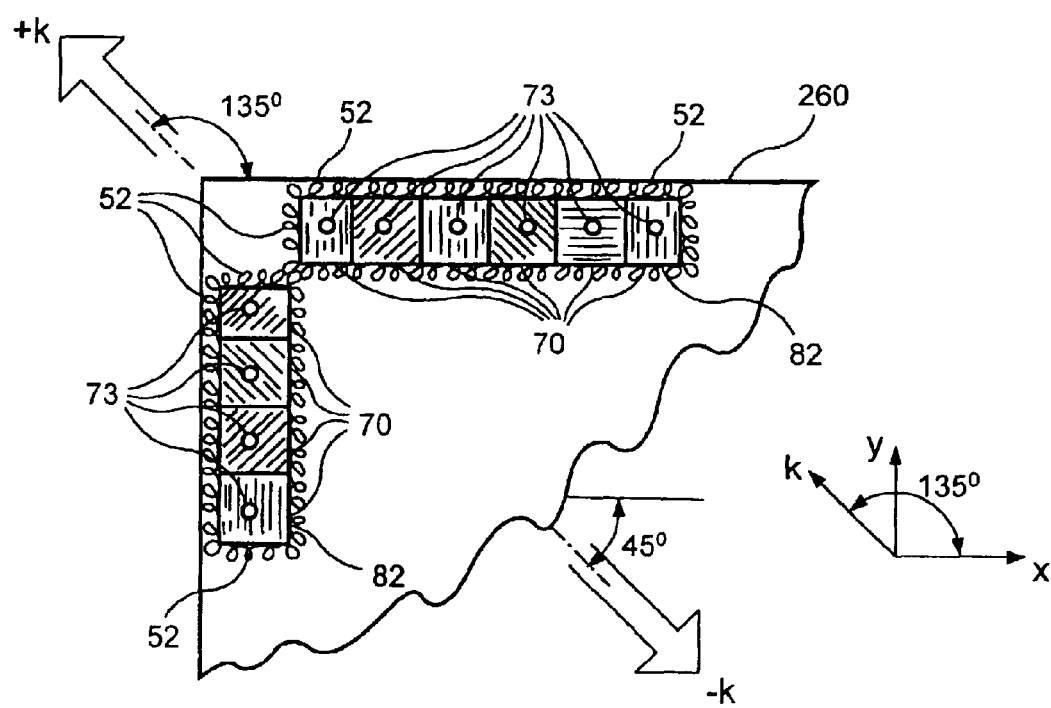
F I G. 4I
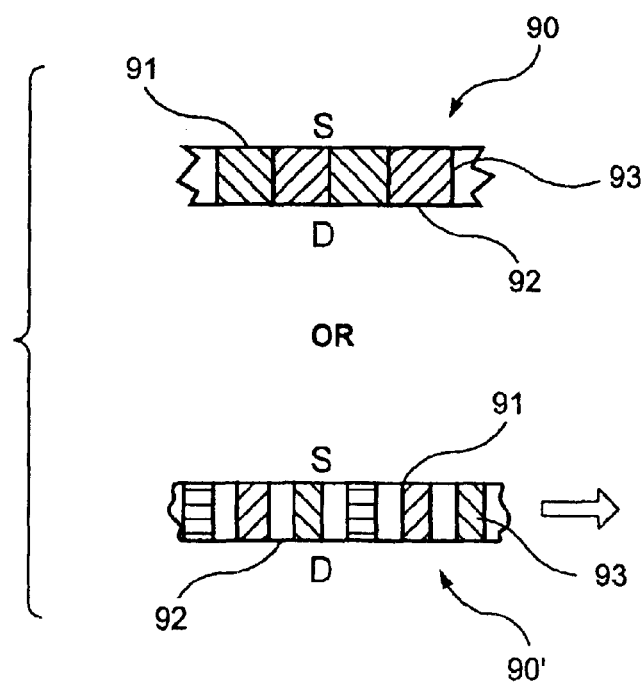
F I G. 4J

PROCESS AND MASK PROJECTION SYSTEM FOR LASER CRYSTALLIZATION PROCESSING OF SEMICONDUCTOR FILM REGIONS ON A SUBSTRATE

CROSS-REFERENCE TO RELATED APPLICATIONS

This application is a national stage application of PCT Application No. PCT/US01/44415 which was filed on Nov. 27, 2001 and published in English on May 30, 2002 as International Publication No. WO 02/42847 (the "International Application"). This application claims priority from the International Application pursuant to 35 U.S.C. §365. The present application also claims priority under 35 U.S.C. §119 from U.S. patent application Ser. No. 60/253,256 filed Nov. 27, 2000. The entire disclosures of these applications are incorporated herein by reference.

NOTICE OF GOVERNMENT RIGHTS

The U.S. Government has certain rights in this invention pursuant to the terms of the Defense Advanced Research Project Agency award number N6600198-1-8913.

FIELD OF THE INVENTION

The present invention relates to techniques for processing of semiconductor films, and more particularly to techniques for processing semiconductor films using patterned laser beamlets.

BACKGROUND OF THE INVENTION

Techniques for fabricating large grained single crystal or polycrystalline silicon thin films using sequential lateral solidification are known in the art. For example, in U.S. patent application Ser. No. 09/390,537, the entire disclosure of which is incorporated herein by reference herein and which is assigned to the common assignee of the present application, particularly advantageous apparatus and methods for growing large grained polycrystalline or single crystal silicon structures using energy-controllable laser pulses and small-scale translation of a silicon sample to implement sequential lateral solidification have been disclosed. The sequential lateral solidification techniques and systems described therein provide that low defect density crystalline silicon films can be produced on those substrates that do not permit epitaxial regrowth, upon which high performance microelectronic devices can be fabricated.

While the above-identified patent document discloses a particularly advantageous system for implementing sequential lateral solidification, there have been attempts to modify other systems to implement sequential lateral solidification. One such system is disclosed in U.S. Pat. No. 5,285,236 ("the '236 patent"), the entire disclosure of which is incorporated herein by reference.

Referring to FIG. 1, the '236 patent discloses a 1:1 projection irradiation system. In particular, an illumination system 20 of this projection irradiation system generates a homogenized laser beam which passes through an optical system 22, a mask 14, a projection lens and a reversing unit to be incident on a substrate sample 10. However, in this prior art projection irradiation system, the energy density on the mask 14 must be greater than the energy density on the substrate 10. This is problematical when processes requiring high fluence on the substrate 10 are considered, as the high energy density incident on the mask 14 can cause physical damage to the mask 14. In addition, such high energy laser light can cause damage to the optics of the system. Accordingly, there exists a need for an improved projection irradiation system of the type described in the '236 patent for implementing the sequential lateral solidification process without damaging the mask 14.

SUMMARY OF THE INVENTION

One of the objects of the present invention is to provide an improved projection irradiation system and process to implement the sequential lateral solidification. Another object of the present invention is to provide a system and process using which, the mask of utilized for shaping the laser beams and pulses is not damaged or degraded due to the intensity of the beams/pulses. It is also another object of the present invention to increase the lifetime of the optics of the system by decreasing the energy being emitted through the optical components (e.g., projection lenses).

In order to achieve these objectives as well as others that will become apparent with reference to the following specification, the present invention generally provides that an irradiation beam is caused to pass through a beam splitter to become two beams, each providing partial intensity of the energy of the original beam.

In one exemplary embodiment of the present invention, a process and system for processing a silicon thin film on a sample are provided. In particular, an irradiation beam generator is controlled to emit successive irradiation beam pulses at a predetermined repetition rate. These irradiation beam pulses are then separated into a first set of beam pulses and a second set of beam pulses. The first set of beam pulses are caused to irradiate through a mask to produce a plurality of beamlets. The second set of beam pulses and the beamlets are caused to impinge and irradiate at least one section of the silicon thin film. When the second set of beam pulses and the beamlets simultaneously irradiate the section of the silicon thin film, this combination provides a combined intensity which is sufficient to melt the section of the silicon thin film throughout an entire thickness of the section. The irradiation beam generator arrangement may emit the successive irradiation beam pulses at a predetermined repetition rate.

In another exemplary embodiment of the present invention, the irradiation beam pulses can be forwarded to a beam splitter which separates the irradiation beam pulses into the first set of beam pulses and the second set of beam pulses. The beam splitter is preferably located upstream in a path of the irradiation beam pulses from the mask, and separates the irradiation beam pulses into the first set of beam pulses and the second set of beam pulses prior to the irradiation beam pulses reaching the mask.

In still another embodiment of the present invention, the first set of beam pulses has a corresponding intensity which is lower than an intensity required to damage, degrade or destroy the mask. Also, the second set of beam pulses can be prevented from being forwarded to the mask, e.g., by diverting the second set of beam pulses away from the mask prior to the second set of beam pulses reaching the mask. In addition, the second set of beam pulses preferably has a corresponding intensity which is lower than an intensity required to melt the section of the silicon thin film throughout the entire thickness thereof.

In yet another embodiment of the present invention, when the section of the silicon thin film is irradiated, this irradiated and melted section of the silicon thin film is allowed to re-solidify and crystallize. After the section of the silicon thin film re-solidifies and re-crystallizes, the sample is translated so that the beamlets and the second set of beam pulses impinge a further section of the silicon thin film. This further section at least partially overlaps the section that was allowed to re-solidify and re-crystallize. Also, the sample can be microtranslated so that the beamlets and the second set of beam pulses impinge at least one previously irradiated, fully melted, re-solidified and re-crystallized portion of the section of the silicon thin film.

The beamlets and the second set of beam pulses can irradiate and fully melt the section of the silicon thin film from a microtranslated location of the sample. The mask may have a dot-like pattern such that dot portions of the pattern are the oblique regions of the mask which prevent the first set of beam pulses to irradiate there through. Also, the mask may have a line pattern such that line portions of the pattern are the oblique regions of the mask which prevent the first set of beam pulses to irradiate there through. Furthermore, the mask may have a transparent pattern such that transparent portions of the pattern do not include any oblique regions therein.

It is also possible to provide beam extending devices in the path of the first set of beam pulses and/or the second set of beam pulses.

The accompanying drawings, which are incorporated and constitute part of this disclosure, illustrate a preferred embodiment of the invention and serve to explain the principles of the invention.

BRIEF DESCRIPTION OF THE DRAWINGS

FIGS. 4A–4I are illustrations of a radiation beam pulse intensity pattern and the grain structure of exemplary sections of a film sample at different stages of lateral solidification ("LS") processing in accordance with a first exemplary embodiment of a process of the present invention;

FIG. 4J is an exemplary top view illustration of a thin film device which can be fabricated using the process illustrated in FIGS. 4A–4I.

DETAILED DESCRIPTION

Figure 2:
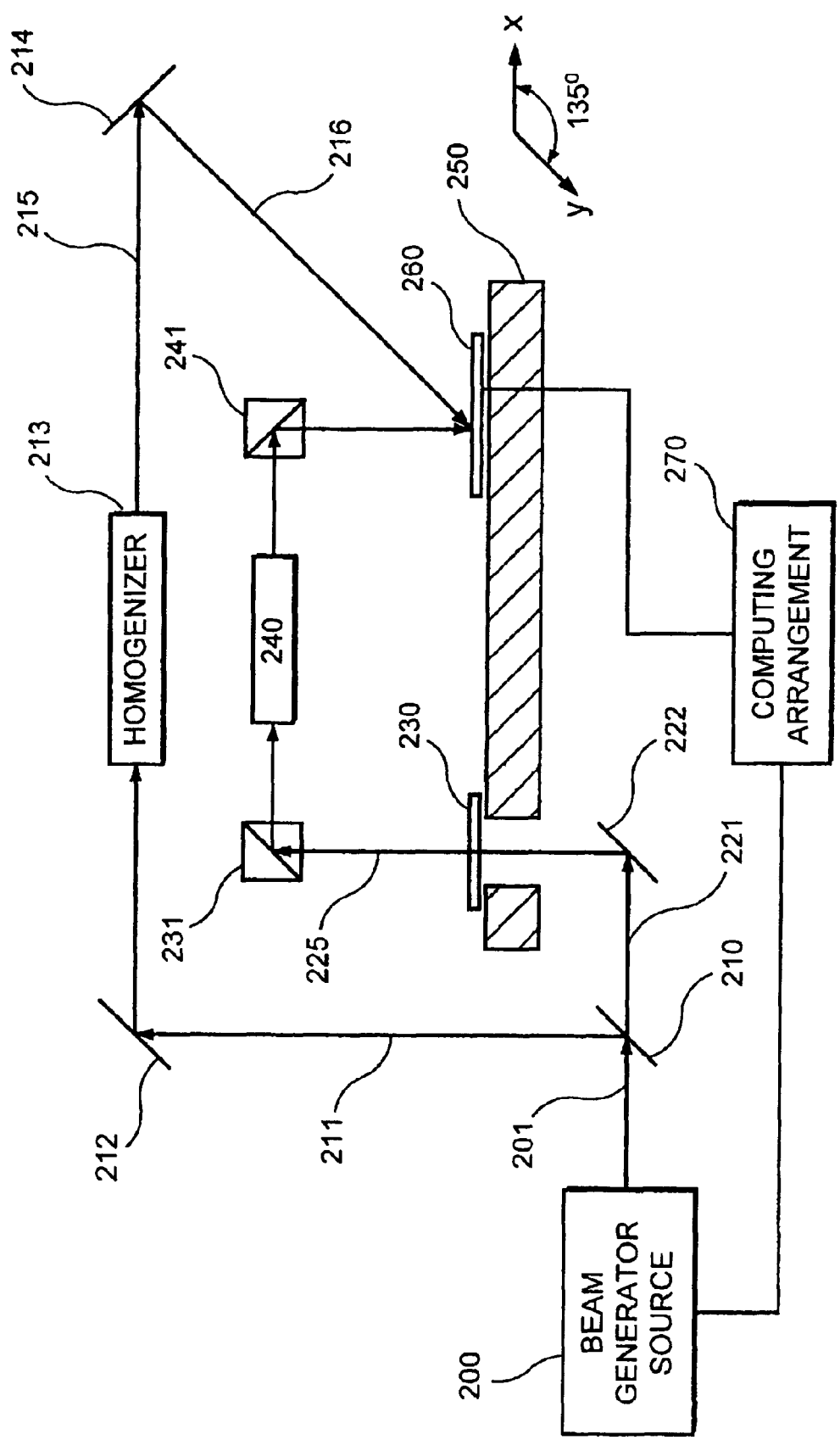
FIG. 2 is a schematic block diagram of an exemplary embodiment of a projection irradiation system according to the present invention.

An exemplary embodiment of a projection irradiation system according to the present invention is shown as a schematic block diagram in FIG. 2. In particular, a beam source 200 (e.g., a pulsed excimer laser) generates an excimer laser beam 201 (composed of beam pulses) which passes through a beam splitter 210 to become two beams 211, 221. In one exemplary implementation of the present invention, these two split beams 211, 221 may each have 50% of the energy that of the original beam 201. It is within the scope of the present invention to possibly utilize other energy combinations with the exemplary system of the present invention illustrated in FIG. 2. Each of the beams 211, 221 is composed of a set of beam pulses.

The first split beam 211 can be redirected by a mirror 212 toward a homogenizer 213, which then outputs a homogenized beam 215. Thereafter, the homogenized beam 215 (and its respective beam pulses) can be redirected by a second mirror 214 so as to be incident on a semiconductor sample 260 which is held by a sample translation stage 250. It should be noted that other samples, such as metallic, dialectric, or polymeric films may be substituted for the silicon semiconductor sample 260.

During a substantially same time interval, the second split beam 221 (and its respective pulses) can be redirected by a mirror 222 to pass through a mask 230. The mirror is arranged such that the second split beam 221 is aligned with the mask 230 to allow the second split beam 221 (and its pulses) to be irradiated there through and become masked beam pulses 225. The masked beam pulses 225 can then be redirected by a second mirror 231 to pass through a projection lens 240. Thereafter, the masked beam pulses 225 which passed through the projection lens 240 are again redirected to a reversing unit 241 so as to be incident on the semiconductor sample 260. The mask 230, the projection lens 240 and the reversing unit 241 may be substantially similar or same as those described in the above-identified '236 patent. While other optical combinations may be used, the splitting of the original beam 201 should preferably occur prior to the original beam 201 (and its beam pulses) being passed through the mask 230.

It should be understood by those skilled in the art that instead of a pulsed excimer laser source, the beam source 200 may be another known source of short energy pulses suitable for melting a thin silicon film layer in the manner described herein below, such as a pulsed solid state laser, a chopped continuous wave laser, a pulsed electron beam or a pulsed ion beam, etc., with appropriate modifications to the radiation beam path from the source 200 to the sample 260. The translations and microtranslations of the sample stage 250 are preferably controlled by a computing arrangement 270 (e.g., a computer which uses Intel Pentium® 4 microprocessor) which is coupled to the beam source 200 and the sample stage 250. It is also possible for the computing arrangement 270 to control the microtranslations of the mask 230 so as to shift the intensity pattern of the first and second beams 211, 221 with respect to the sample 260. Typically, the radiation beam pulses generated by the beam source 200 provide a beam intensity in the range of 10 mJ/cm$^2$ to 1J/cm$^2$, a pulse duration (FWHM) in the range of 10 to 103 nsec, and a pulse repetition rate in the range of 10 Hz to 104 Hz.

Figure 1:
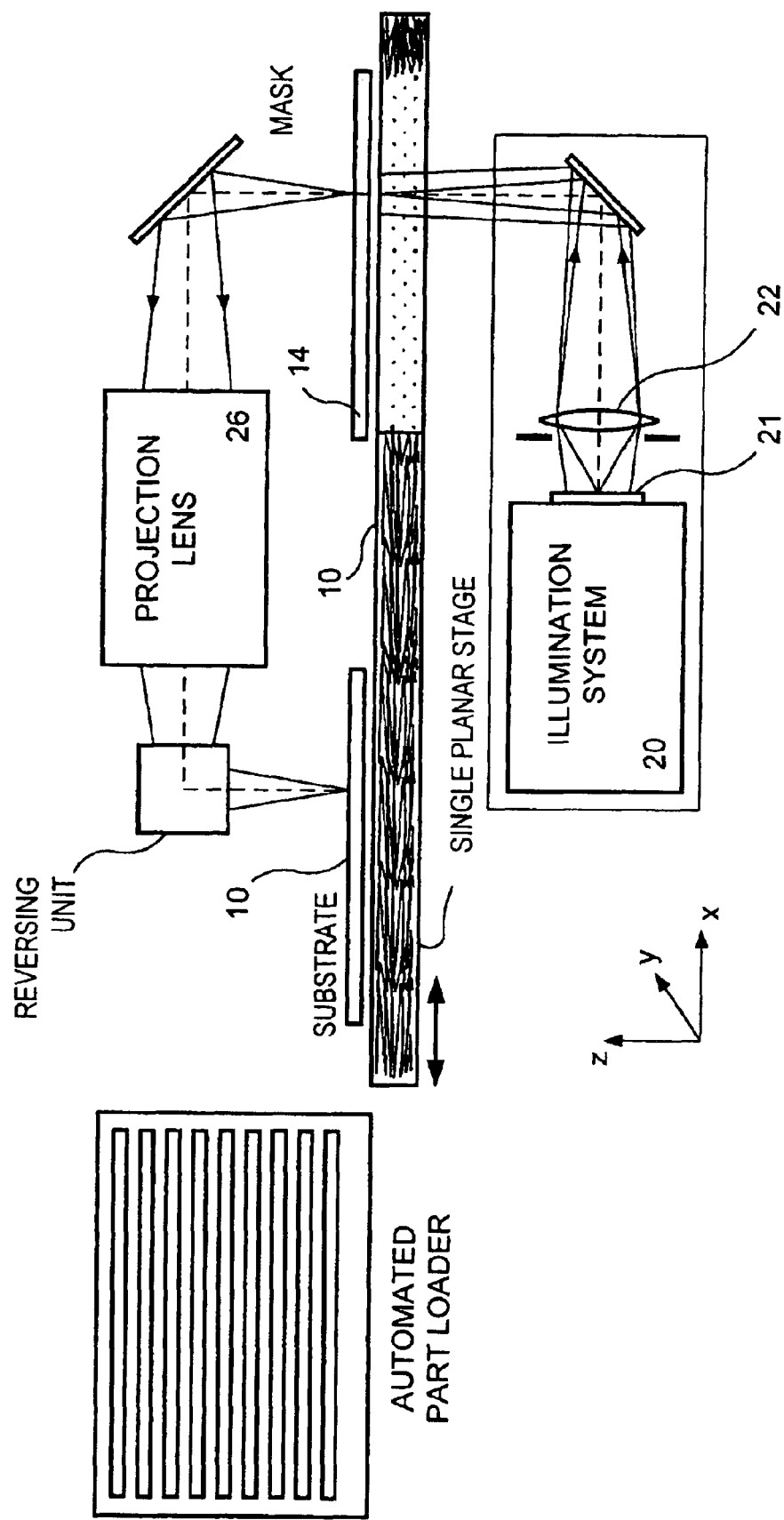
FIG. 1 is a schematic block diagram of a prior art 1:1 projection irradiation system.
Figure 3A:
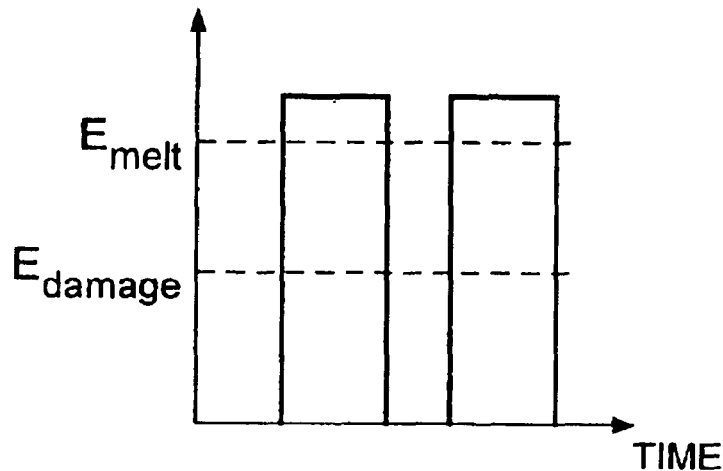
FIG. 3A is an exemplary graph which represents the energy density pattern at a silicon film sample using the prior art projection irradiation system illustrated in FIG. 1.

FIG. 3A shows is an exemplary graph which represents the energy density pattern at a silicon film sample using the prior art projection irradiation system illustrated in FIG. 1. In particular, this graph illustrates the energy density pattern at the plane of the substrate sample 10 when there is no beam splitter 201, as provided in the prior art system of FIG. 1. As shown in FIG. 3A, in order for particular portions of the silicon thin film of the sample to be fully melted throughout its thickness, the energy of the laser pulses $E_{melt}$) has to be high enough for such melting, and likely exceeds the damage threshold ($E_{damage}$) for the mask 230.

Figure 3B:
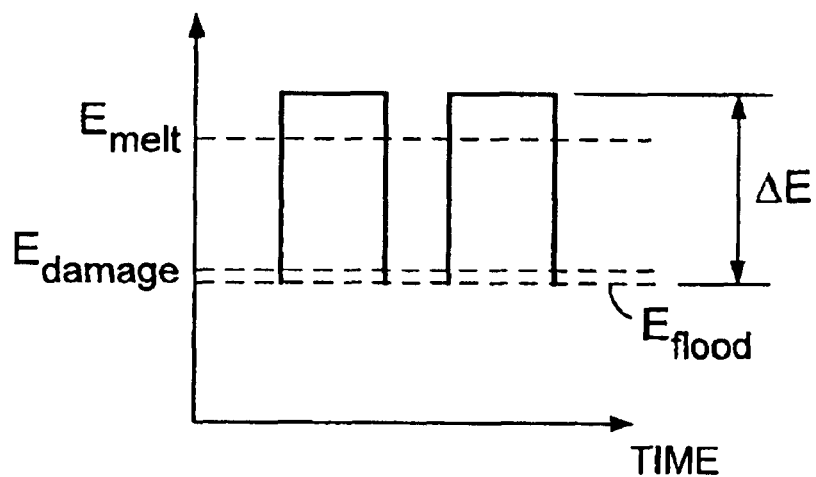
FIG. 3B is an exemplary graph which represents the energy density pattern at the silicon film sample using the exemplary projection irradiation system of the present invention illustrated in FIG. 2.

FIG. 3B shows an exemplary graph which represents the energy density pattern at the silicon film sample using the exemplary embodiment of the projection irradiation system illustrated in FIG. 2, in which the beam splitter 211 is being used to split the original beam 201 into the two split beams 211, 221. In particular, the energy density pattern of the second split beam 221 is selected to be below the damage threshold ($E_{damage}$) at the plane of the mask 230. In this manner, the mask 230 would not be damaged or degraded by the beam generated by the irradiation beam emitted by the beam source 200. Meanwhile, the homogenized beam pulses 216, which correspond to the pulses of the first split beam 211, can irradiate the sample 260 such that the intensity of the pulses 216 is not enough to melt the silicon thin film of the sample 260 throughout its thickness. When the intensity of the second split beam 221 is added to that of the first split beam 211, the resultant combination of beam pulses has the intensity which is enough to melt the silicon thin film of the sample 260 throughout its entire thickness.

Figure 4A:
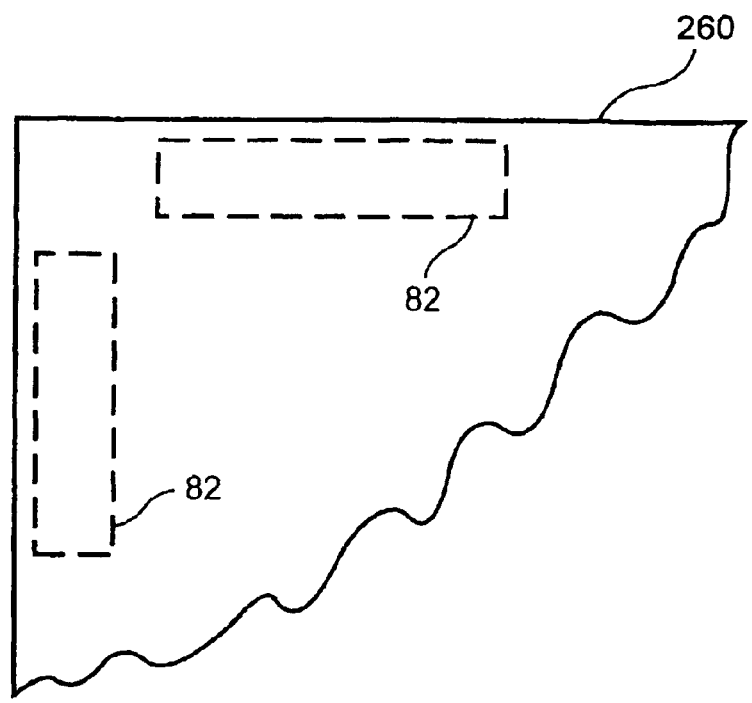

A first exemplary embodiment of the process of the present invention shall now be described with reference to FIGS. 4A–4I. In particular, FIG. 4A shows an exemplary region of the sample 260, such as a partially fabricated integrated circuit device, which includes at least one section 82 (and preferably more than one section) of the silicon thin film thereon. This section 82 may be composed of certain areas extending in a horizontal direction, as well as other areas extending in a vertical direction. The section 82, as well as other section of the silicon thin film on the sample 160 have small grains and grain boundaries randomly oriented in various directions therein. The thickness of the section 82 may be in the range of less than 20 nannometers to 2 μm. Other thicknesses of the silicon thin films and sections thereof are conceivable for use, and are within the scope of the present invention.

Figure 4B:
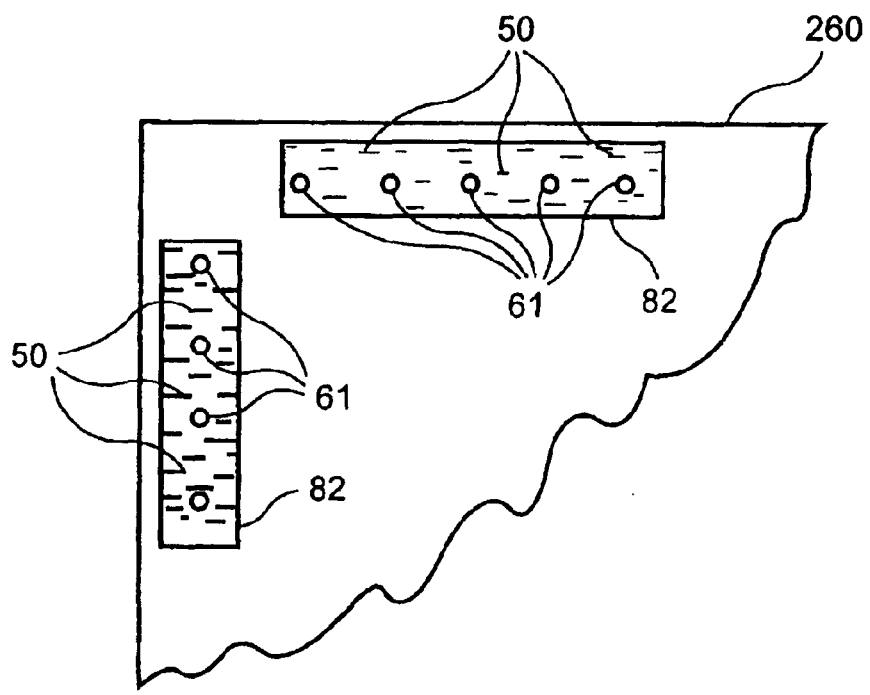

FIG. 4B shows the section 82 after being irradiated by a first radiation beam pulse having a desired intensity pattern. In the present exemplary embodiment, this pattern is a "pocka-dot" pattern which is preferably aligned with certain areas of the section 82. The mask 230 of FIG. 2 can be used to effectuate such pattern upon it being irradiated by the second split beam pulses 221. In particular and to add further detail, the mask 230 has a pattern which consists of one or more sets of 1-micrometer orthogonally positioned opaque dot-like regions. Thus, the set of the opaque regions on the mask 230 do not allow the pulse of the second split beam 221 to pass there through so as to prevent the irradiation of the corresponding areas on the section 82. However, the regions on the mask 230 surrounding the opaque dot-like regions allow the pulses to pass there through so as to allow the exiting irradiation beam pulses to irradiate and melt the respective other areas of the section 82 (melted regions 50). The resultant beam pulse would have an intensity pattern which includes "shadow" regions 61 corresponding to the opaque dot-like regions of the mask 230.

When the second split beam pulses 221 are passed through the mask 230, with the first split beam pulses irradiating (but not melting) the sample 260, the combined first and second split beam pulses 211, 221 completely melt areas 50 of the section 82, but not dot-shaped unmelted areas 61. According to the exemplary embodiment shown in FIG. 2B, the unmelted areas 61 are provided at regular intervals along the centerline of the section 82. In particular, when the section 82 of the silicon thin film is irradiated by a first set of the first and second split beam pulses 211, 221 (with the second split beam pulses 221 having the intensity pattern defined by the mask 230), each area irradiated by the unblocked second split beam pulses 221 is melted throughout its entire thickness, while each area of the section 82 that is blocked by the opaque pattern of the mask 230 remains at least partially unmelted. Therefore, the unmelted area 50 of the section 82 has the original grain structure of the section 82 of the silicon thin film as it was originally formed.

The shadow regions of the intensity pattern, the shape of which corresponds to that of the unmelted areas 61, which may have any shape, such as a circle, a square, etc., have a small cross-sectional area. It is preferable for the shadow regions to be large enough so that the melted surrounding areas of the silicon thin film provided on the sample 260 does not cause a complete melting of the areas 61 on the section 82 that are associated with the respective shadow regions. In accordance with the invention and as described above, the areas 61 of the section 82 overlapped by respective ones of the shadow regions should preferably remain at least partially unmelted.

Figure 4C:
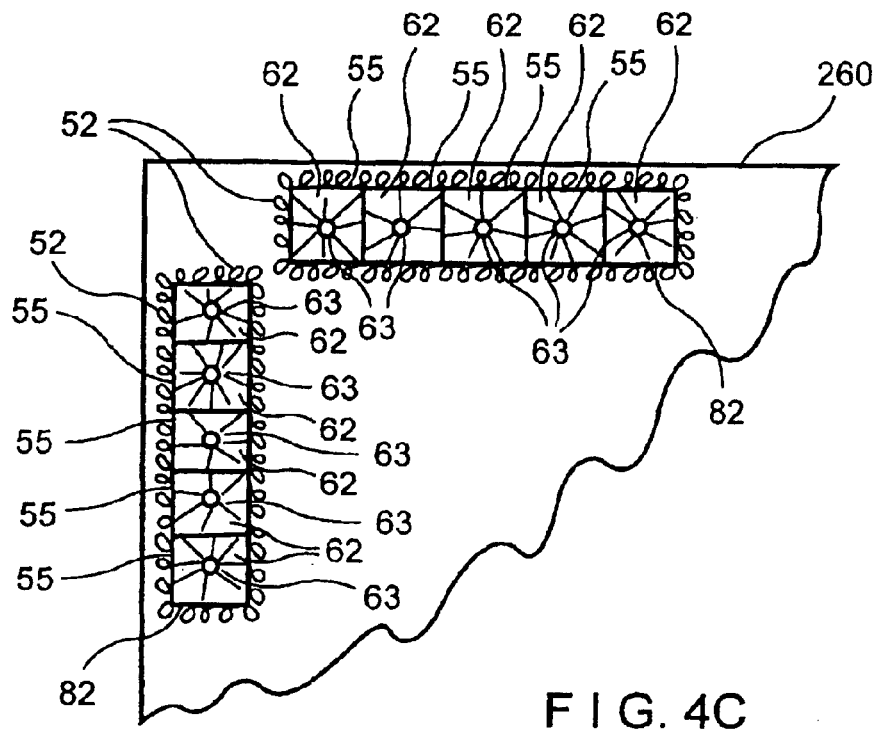

Turning to FIG. 4C, after the section 82 of the silicon thin film provided on the sample 260 is irradiated via a first set of the first and second split beam pulse 211, 221, the melted areas of the section 82 are permitted to cool and re-solidify. Since the at least partially unmelted areas 63 of the section 82 of the silicon thin film have the original grain structure of the areas 61 of the section 82, such grain structure in each-at least partially unmelted area 63 seeds lateral growth of grains into the adjoining re-solidifying melted regions of the section 82. During such re-solidification of each melted area, the grains grow outward from each one of the at least partially unmelted areas 63 in a respective re-solidification area 55 immediately surrounding the at least partially unmelted area 63 in the section 82 of the silicon thin film. After the re-solidification of the regions 55, areas 52 are formed at the edges or borders of these regions 55. The areas 52 are small grained polycrystalline silicon areas formed due to a nucleation, i.e., the sections of the silicon thin film corresponding to these areas 52 have been partially melted and re-solidified with small grains provided therein. Each re-solidification region 55 is bounded by the respective areas 52 and the neighboring re-solidification region 55, as well as the areas 52. The grain growth in each of the melted and re-solidifying regions 55 is effectuated by seeding thereof via the at least partially unmelted region 63 within the respective re-solidification region 55.

The abutting grain growth distance of the grains growing from each one of the at least partially unmelted areas 63 is approximately half the width of the melted regions as defined by the width of the beamlets (or shaped beam pulses) exiting from the mask 230. In this manner, larger grains 62 are formed in each of the re-solidification areas 55 after the re-solidification of the melted regions of the section 82 is completed. The spacing between the adjacent at least partially unmelted areas 63 should be such that the grains growing from each such unmelted area 63 abuts the grains growing from its two adjacent at least partially unmelted areas 63 before the re-solidification of the melted regions of the section 82 of the silicon thin film is completed (i.e., before the nucleation of new grains occurs in the intervening spaces). The characteristic growth distance of the grains is the distance that the grains grow before the nucleation of new grains occurs.

Figure 4D:
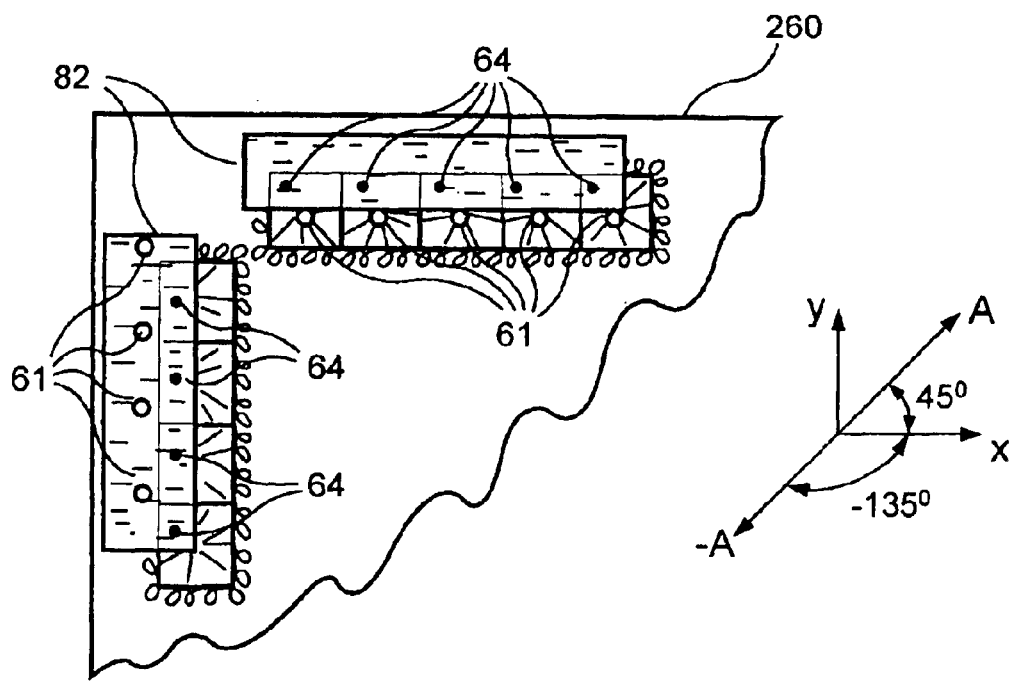
Figure 4D:
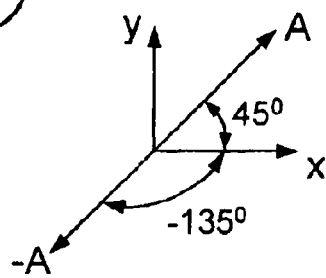

Turning to FIG. 4D, because the position of impingement of the first and second split beam pulses 211, 221 on the section 82 of the silicon thin film is preferably fixed, the sample 260 is then repositioned by the sample translation stage 250 under the control of the computing arrangement 270. This is done so that the shadow regions 64 of the intensity pattern of a second set of the first and second split beam pulses 211, 221 (generated when the second set of the second split beam pulses 221 are passed through the mask 230) can each be slightly shifted by a distance less than the largest abutting grain growth distance (due to the irradiation of the first set of the first and second split beam pulses 211, 221 with respect to the previous positions on the section 82 of the shadow regions 61 of the intensity pattern of the first set of the first and second split beam pulses 211, 221). The abutting grain growth distance is the distance that a grain grows from an at least partially unmelted region in an adjoining melted region before abutting another grain growing in the same melted region and before abutting the area 52 (i.e., a nucleation region). In this manner, when the second set of first and second split beam pulses 211, 221 is irradiated on the section 82 of the silicon thin film, each shadow region 64 overlaps a different section within the same re-solidification area 55 formed after the irradiation by the first set of the first and second split beam pulses 211, 221, which is different from the previous shadow region.

For example, the position of the new shadow regions 64 can be shifted from the previous position of the shadow regions 61 by a distance in the range of 0.01 m to 10 m. Such minor repositioning shall be referred to hereinafter as a "microtranslation". Optionally, the mask 230 may be microtranslated (i.e., instead of or together with) the sample 260 to obtain the desired shift of the shadow regions 64 of the intensity pattern when the second set of the first and second split beam pulses 211, 221 irradiates the section 82. Although the beamlets of the intensity pattern of the second set of the first and second split beam pulses 211, 221 are also shifted with respect to that of the intensity pattern of the first set of the first and second split beam pulses 211, 221, the shifted beamlets still overlap all regions of the section 82 not overlapped by the respective shifted shadow regions 64.

As shown in FIG. 4D, after the above-described microtranslation of the sample 260, the system of FIG. 2 irradiates the section 82 with the second set of the first and second split beam pulses 211, 221. This is done so that each region of the section 82 of the silicon thin film that is overlapped by the shifted and unblocked beamlet is melted throughout its entire thickness, and each area of the section 82 which is prevented from being irradiated by a respective region of the dot-type pattern of the mask 230 (i.e., the respective shifted shadow region 64) remains at least partially unmelted. Each one of the at least partially unmelted areas adjoins respective adjacent melted areas. The sample 260 may be microtranslated in any direction so long as each one of the shifted shadow regions 64 overlaps a portion within the same re-solidification area 55 as a portion overlapped by a corresponding one of the shadow regions 61 of the intensity pattern of the first set of the first and second split beam pulses 211, 221. For example, the sample 260 can be microtranslated in the −A direction which is at minus 135° with respect to the X axis, where rotation of the angles in the counterclockwise direction are taken as positive, or the sample 260 can be microtranslated in the +A direction which is at an angle of 45° with respect to the X axis.

Figure 4E:
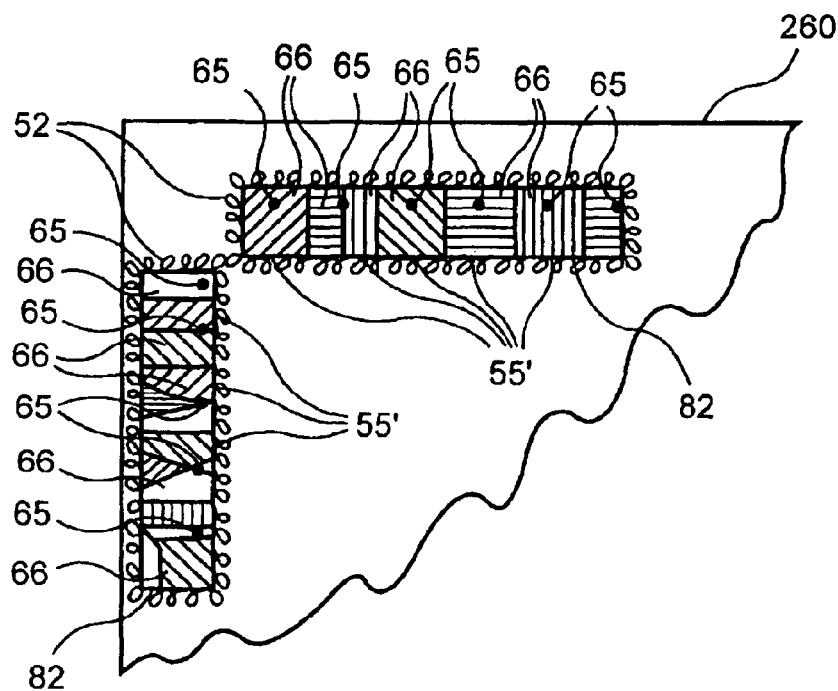

FIG. 4E shows the section 82 of the silicon thin film provided on the sample 260 after the completion of the re-solidification of the melted regions following the irradiation by the second set of the first and second split beam pulses 211, 221. There will be a greater number of the grains that will be grown in a corresponding one of new re-solidification regions 55' upon the re-solidification of each melted region of the section 82 after the irradiation by the second set of the first and second split beam pulses 211, 221. This is because each one of the at least partially unmelted areas 65 after the first microtranslation of the sample 260 and the irradiation by the second set of the first and second split beam pulses 211, 221 contains a smaller number of grains than was contained in each one of the at least partially unmelted areas 63 after irradiation by the first set of the first and second split beam pulses 211, 221. As illustrated in FIG. 4E, the growth of the grains takes place laterally from each of the shifted at least partially unmelted areas 65 to either reach the nucleated areas 52 of the section 82 formed after the re-solidification, or to abut the grains growing from the adjacent shifted at least partially unmelted regions 65 to define the new re-solidification areas 55', the abutting grains having grown by respective abutting growth distances. Referring again to FIG. 4E, each of the new re-solidification areas 55' has fewer and larger grains 66 than those in the previous re-solidification areas 55 as illustrated in FIG. 4C.

Figure 4F:
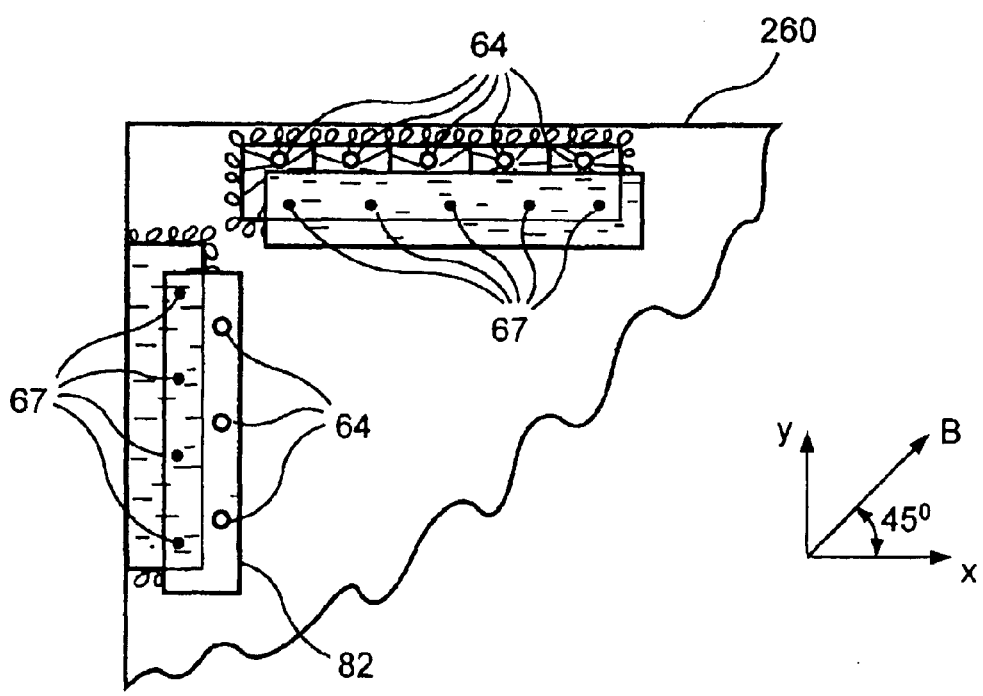

Referring to FIG. 4F, after the re-solidification of the melted areas that followed the irradiation thereof by the second set of the first and second split beam pulses 211, 221 is completed, the sample 260 may be further microtranslated (with respect to the first and second split beam pulses 211, 221) in any direction by a distance less than the largest abutting grain growth distance (after the second set of the first and second split beam pulses 211, 221 irradiated the section 82). This is done so that the twice-shifted shadow regions 67 of the intensity pattern of a third set of the first and second split beam pulses 211, 221 each overlaps or irradiates a different area within a respective one of the re-solidification areas 55. In the exemplary illustration of FIG. 2F, the direction of the further microtranslation B is at 45° with respect to the X axis. After the sample 260 is microtranslated in this direction, the section 82 is irradiated by a third set of the first and second split beam pulses 211, 221 having the same intensity pattern defined by the mask 230, but in the portions where the shadow regions 67 each have been shifted twice. The twice-shifted shadow regions 67 are displaced from respective previous shadow regions 64 by a distance less than the largest abutting grain growth distance after the irradiation by the second set of the first and second split beam pulses 211, 221, for example, in the range of 0.01 m to 10 m. Although the beamlets of the intensity pattern of the third set of the first and second split beam pulses 211, 221 are also shifted with respect to that of the intensity pattern of the second set of the first and second split beam pulses 211, 221, the twice-shifted beamlets still overlap all areas of the section 82 not overlapped by a respective one of the twice-shifted shadow regions 67.

Figure 4G:
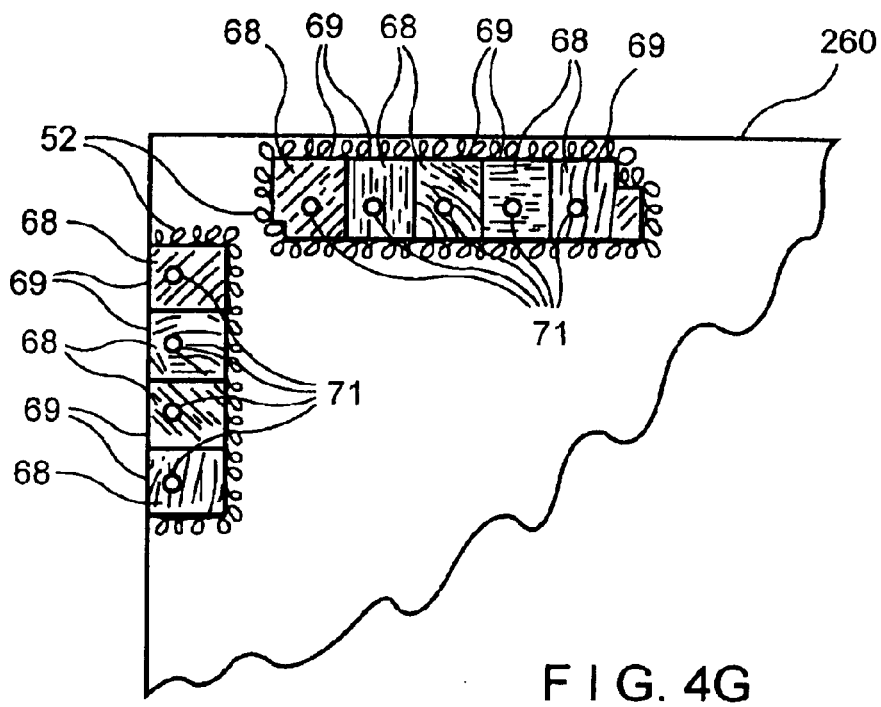
Figure 4H:
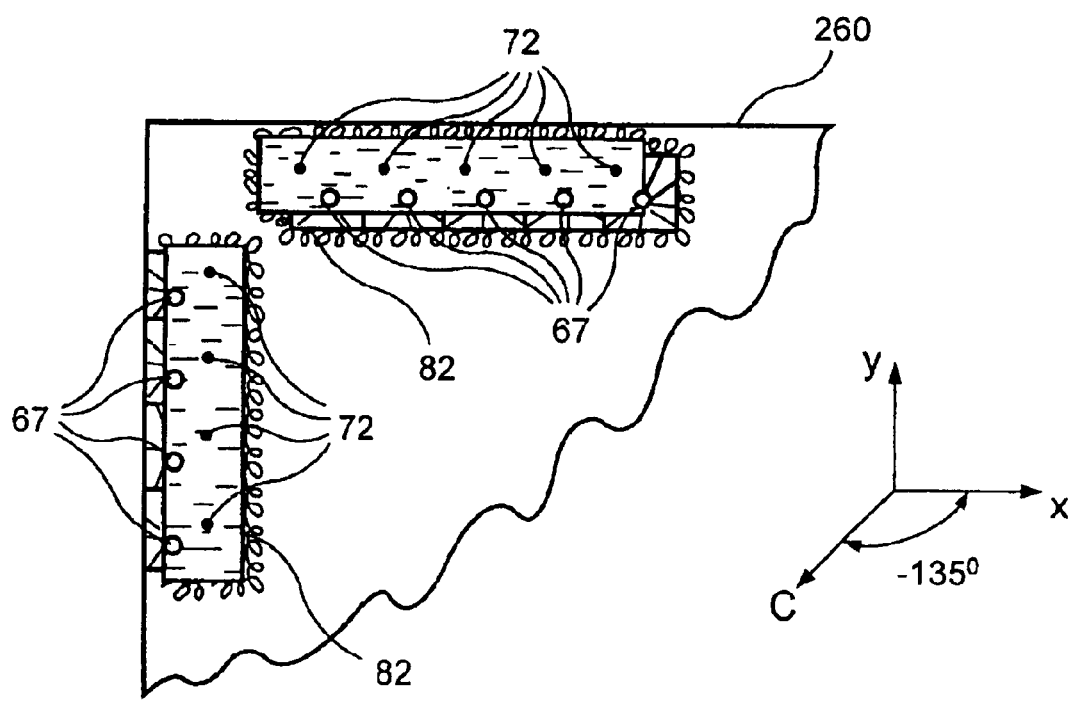

FIG. 4G illustrates the re-solidified section 82 of the silicon thin film provided on the sample 260 after being irradiated by the third set of the first and second split beam pulses 211, 221, and shows the completion of the re-solidification of the melted areas. Because the twice-shifted at least partially unmelted areas 71 each contain a smaller number of grains than was contained in the once-shifted at least partially unmelted areas 65, there will be an equal or smaller number of grains that will be grown in a corresponding one of new re-solidification areas 69 upon the completion of the re-solidification of each melted area of the section 82 (after the section 82 is irradiated by the third set of the first and second split beam pulses 211, 221). As shown in FIG. 4G, the growth of the grains takes place laterally from each of the twice shifted at least partially unmelted areas 71 to either reach the again-nucleated area 52, or to abut grains growing from adjacent twice shifted at least partially unmelted areas 71 to define the new re-solidification areas 69, the abutting grains having grown by respective abutting grain growth distances. Each of the new re-solidification areas 69 has fewer and larger grains 68 than the previous re-solidification areas 55' illustrated in FIG. 4E.

Turning now to FIG. 2H, after each melted area of the section 82 is re-solidified (i.e., following the irradiation by the third set of the first and second split beam pulses 211, 221 is completed), the sample 260 may be further microtranslated with respect to the first and second split beam pulses 211, 221 in any direction by a distance less than the largest abutting grain growth distance after the irradiation by third set of the first and second split beam pulses 211, 221. In this manner, the thrice-shifted shadow regions 63 of the intensity pattern of a fourth set of the first and second split beam pulses 211, 221 overlaps a different area within a respective one of the re-solidification areas 69. In the exemplary embodiment illustrated in FIG. 4H, the direction of a further microtranslation in a direction C is at −135° with respect to the X axis, and the distance of the further microtranslation is in the range of 0.01 m to 10 m. After the sample 260 is microtranslated in this direction by the above noted distance, the section 82 of the silicon thin film is irradiated by the fourth set of the first and second split beam pulses 211, 221 having the same intensity pattern as that of the third set of the first and second split beam pulses 211, 221 illustrated in FIG. 4F, but where the shadow regions 72 and the respective intensity pattern each have been shifted thrice with respect to the section 82.

FIG. 4I show the re-solidified section 82 after it is irradiated by the fourth set of the first and second split beam pulses 211, 221, along with the completion of the re-solidification of each melted area. The at least partially unmelted areas 73 overlapped or irradiated by respective ones of the thrice-shifted shadow regions 63 (i.e., the thrice-shifted at least partially unmelted areas) each contain a single grain. Thus, there would likely be an equal or greater number of the grains that will be grown in a corresponding one of the new re-solidification areas 70 upon the completion of the re-solidification of the melted areas of the section 82. As illustrated in FIG. 4I, the growth of the grains takes place laterally from each one of the thrice-shifted at least partially unmelted areas 73 to either reach the again-nucleated area 52 or to abut the grains growing from adjacent thrice-shifted at least partially unmelted areas 73 to define the new re-solidification areas 70. Each of the new re-solidification areas 70 of the section 82 has a single grain being grown therein, and each grain boundary is substantially perpendicular to a respective one of the section 82 at the location of the grain boundary. It should be understood that the section 82 may be subjected to more or less of the microtranslation, irradiation and re-solidification steps, as described with reference to FIGS. 4A–4I, so as to obtain the desired long-grained crystalline structure illustrated in FIG. 4I in the section 82.

After the completion of the above-described LS processing to obtain a desired crystalline grain structure in the section 82 of the silicon thin film, the sample 260 may be translated to a next section for LS processing therein. For example, the sample 260 may translated in –K direction (which is a direction that is +135° with respect to the X axis) for a distance that is preferably slightly smaller than the diameter of the longest distance between the side walls of the re-solidified areas of the section 82. In this manner, the translated intensity pattern generated by the first and second split beam pulses 211, 221 irradiates a neighboring section of the silicon thin film provided on the sample 260 with is provided at an offset and –45° from the re-solidified areas of the section 82.

FIG. 4J shows a top view of exemplary thin film transistor devices 90, 90' which can be fabricated using the exemplary process illustrated in FIGS. 4A–4I and described above. Each of the transistor devices 90, 90' includes a source (S) terminal 91, 91' and a drain (D) terminal 92, 92'. In addition, these transistor devices 90, 90' have respective active channel region 93, 93' which are positioned within the large grained silicon area. Such positioning will yield an improved electrical performance, and permit the incorporation of highly functional electrical circuitry.

A second exemplary embodiment of the process according to the present invention shall now be described with reference to FIGS. 5A–5E. For purposes of illustration, the same configuration of the section 82 of the silicon thin film provided on the sample 260 used to describe the first exemplary embodiment of the process (as illustrated in FIGS. 4A–4I) is used herein to describe the present embodiment of the process according to the present invention. As in the first exemplary embodiment of the process, the section 82 initially has small grains and grain boundaries that are oriented in random directions.

Figure 5A:
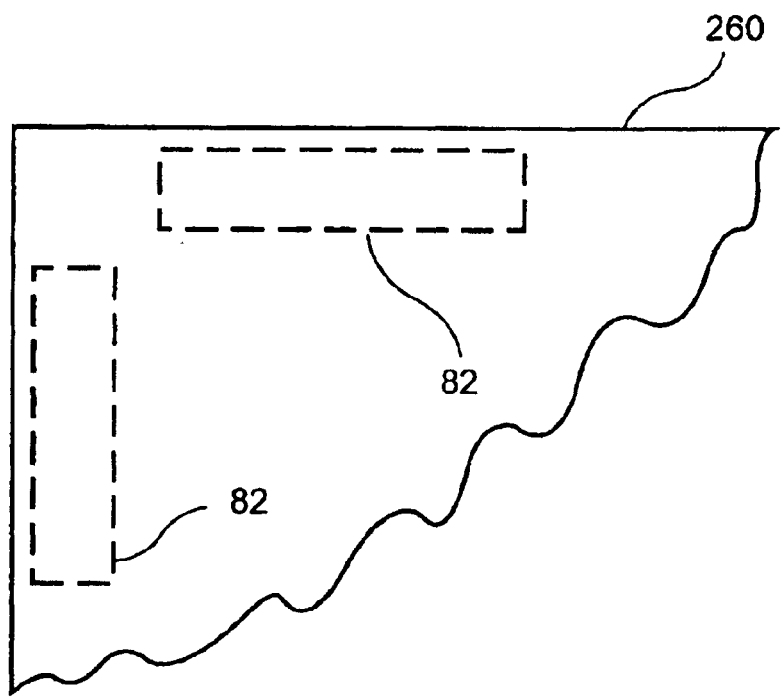
FIGS. 5A–5E are illustrations of a radiation beam pulse intensity pattern and the grain structure of exemplary sections of a film sample at different stages of the LS processing in accordance with a second exemplary embodiment of the process of the present invention.
Figure 5B:
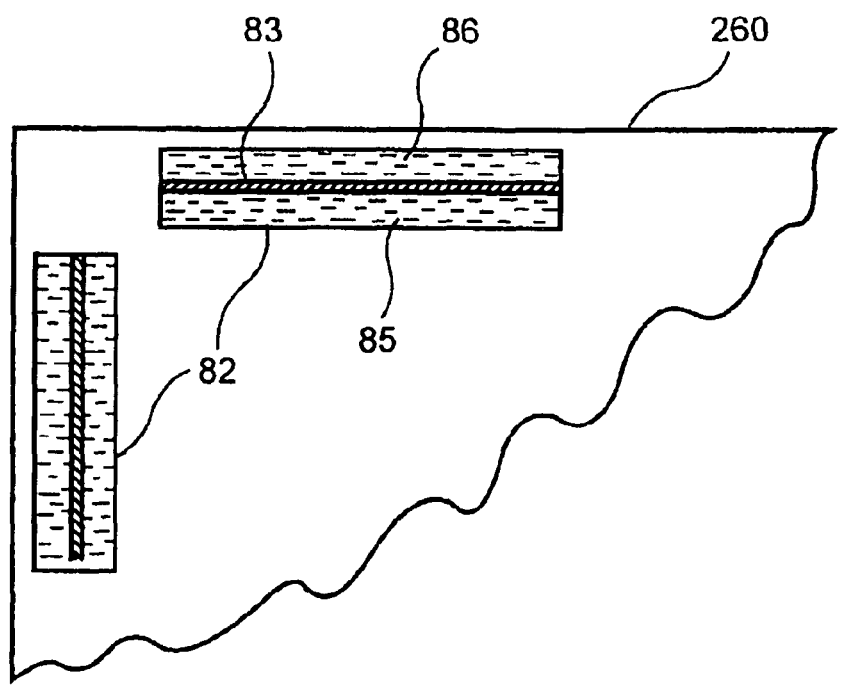

Referring to FIG. 5B, the section 82 of the silicon thin film is irradiated by a first set of the first and second split beam pulses 211, 221 having an intensity pattern as defined by another exemplary embodiment of the mask 230. This exemplary mask 230 includes a relatively narrow opaque strip which is surrounded by the transparent segments of the mask. The opaque strip is configured such that it does not allow the portion of the second split beam pulse 221 irradiating it to pass there through, while the transparent segments surrounding the opaque strip allow portions of the second split beam pulses 221 to be irradiated there through. Accordingly, when the second split beam pulse 221 is applied to this mask 230, the intensity pattern of the resultant beam pulses has strip-like shadow regions 83 corresponding in shape to the opaque strips of the mask 230. In addition to the shadow regions 83, the intensity pattern of the first radiation beam pulses, as defined by the mask 230, also includes the beamlets that irradiate all areas of the section 82 not overlapped by the shadow regions 83. Advantageously, the width of the shadow regions 83 can be in the range of 0.01 m to 5 m.

Initially, the sample 260 is positioned so that the shadow regions 83 of the intensity pattern of a first set of the first and second split beam pulses 211, 221 overlaps the section 82 along the center line of the section 82 of the silicon thin film. Upon being irradiated by the first set of the first and second split beam pulses 211, 221, each of areas 85, 86 of the section 82 that is overlapped by the non-shadowed region of the intensity pattern of the second split beam pulses 221 is melted throughout its entire thickness, while each portion of the section 82 overlapped by the respective shadow region 83 remains at least partially unmelted. The shadow regions 83 of the intensity pattern of the second split beam pulses 211 are sufficiently wide so that the thermal diffusion from the melted areas 85, 86 in the section 82 does not significantly melt the areas of the section 82 overlapped by the respective shadow regions 83. After the irradiation by the first set of the first and second split beam pulses 211, 221, the at least partially unmelted regions 84 (see FIG. 5C) in the section 82 will have the original grain structure of the section 82 before the LS processing.

Figure 5C:
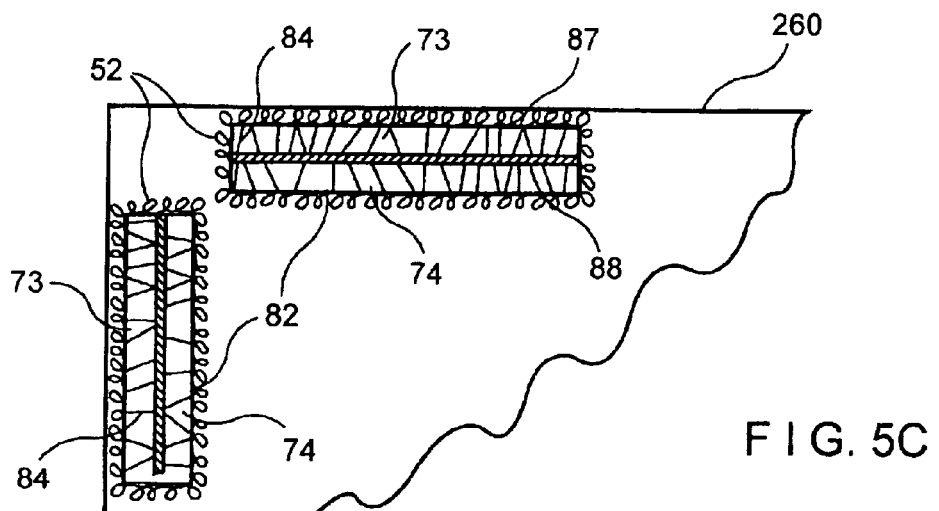

Turning now to FIG. 5C, upon the cooling and re-solidification of the melted areas 85, 86 in the section 82 after the irradiation by the first set of the first and second split beam pulses 211, 221, a lateral growth of the grains will occur outwardly from each one of the at least partially unmelted areas 84 to the area 52 which was not fully melted and then re-solidified (i.e., the nucleated small grain area). In this manner, the re-solidification areas 87, 88 are formed in the section 82 with each one of the re-solidification areas 87, 88 having a respective row 73, 74 of larger crystal grains with grain boundaries oriented at larger angles with respect to the section 82.

Figure 5D:
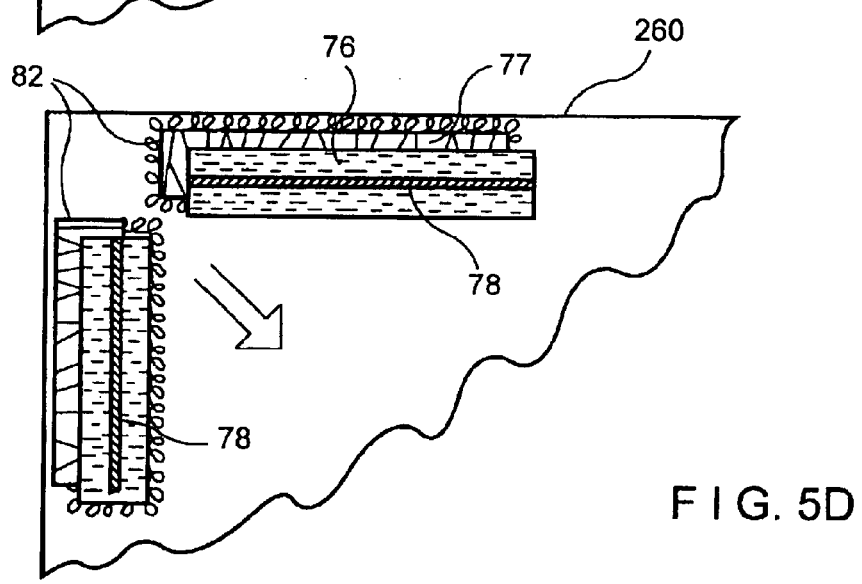
Figure 5E:
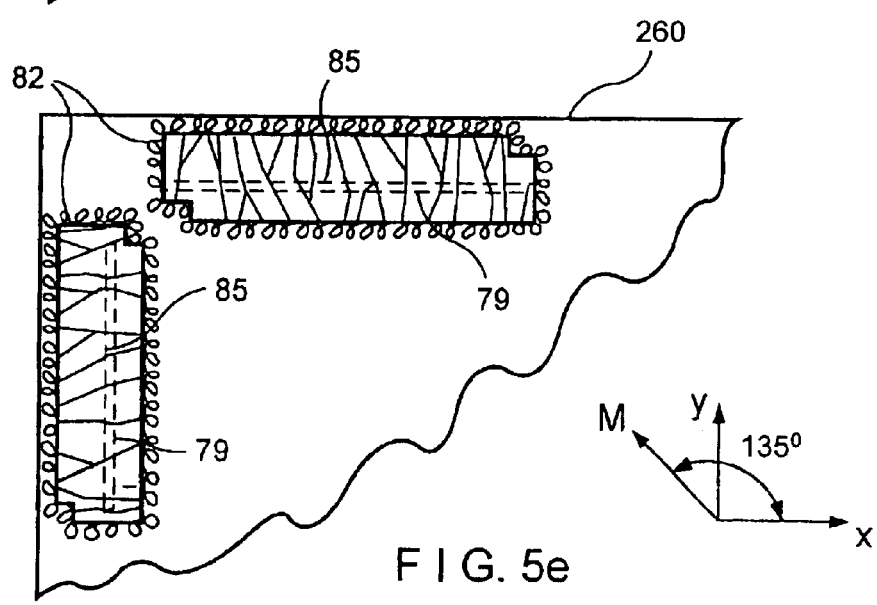

Turning now to FIG. 5D, after the completion of the re-solidification of the melted areas 85, 86 in the section 82 that follows the irradiation by the first set of the first and second split beam pulses 211, 221, the sample 260 is microtranslated in the –M direction at 135° with respect to the X axis, or the mask 230 (shown in FIG. 2) may be microstranslated in the –M direction at –45° with respect to the X axis, to cause the shadow regions 76 of the intensity pattern of a second set of the first and second split beam pulses 211, 221 to be shifted so as to overlap respective ones of the rows 73 of the grains in the section 82. It should be understood by those skilled in the art that either the sample 260, the mask 230 or both may be microtranslated so as to cause the shadow regions 76 of the intensity pattern of the second set of the first and second split beam pulses 211, 221 to overlap respective ones of the rows 74 of grains. Although the beamlets of the intensity pattern of the second set of the first and second split beam pulses 211, 221 are also shifted with respect to the position of the intensity pattern of the first set of the first and second split beam pulses 211, 221, the shifted beamlets still overlap all areas of the section 82 not overlapped by a respective one of the shifted shadow regions 76. Except for the shifting of the shadow regions 76 and the beamlets, the intensity pattern of the second set of the first and second split beam pulses 211, 221 is the same as that of the first set of the first and second split beam pulses 211, 221.

After the microtranslation of the sample 260 or the mask 230 (or both), the section 82 is irradiated by the second set of the first and second split beam pulses 211, 221. This is done because each area of the section 82 overlapped by the shifted beamlet is melted throughout its entire thickness, while each area of the section 82 overlapped by a respective one of the shifted shadow regions 76 remains at least partially unmelted. Each at least partially unmelted areas adjoins adjacent melted areas. Because the at least partially unmelted areas will contain larger grains with grain boundaries forming larger angles with respect to the section 82 than the grains and grain boundaries of the original section 82, upon the re-solidification of the melted areas 77, 78 in the section 82, these larger grains will seed the growth of the grains laterally in each direction from the at least partially unmelted areas 85 towards the re-nucleated areas 52 of the section 82 so that the section 82 will have larger grains as illustratively represented in FIG. 5E. After re-solidification of the melted areas 77, 78 and following the irradiation of the section 82 by the second set of the first and second split beam pulses 211, 221 is completed, additional iterations of the microtranslation of the either the sample 260 or the mask 230 in an appropriate direction, the irradiation by a further set of the first and second split beam pulses 211, 221, and the re-solidification of each melted area of the section 82 of the silicon thin film provided on the sample 260 may be carried out to further reduce the number of grains in the section 82.

After completion of the LS processing of the section 82 to obtain a desired crystalline grain structure in the section 82 of the silicon thin film as described above with reference to FIGS. 5A–5E, and as discussed above with reference to the exemplary process of FIGS. 4A–4I, the sample 260 may be translated to a next section of the silicon thin film for LS processing therein. In particular, the sample 260 may be translated to a further section so that the LS processing can be performed therein. For example, the sample 260 may translated in –M direction for a distance such that the next irradiation by the first and second split beam pulses 211, 221 slightly overlaps the previously irradiated, completely melted and re-solidified areas of the section 82. In this manner, the translated intensity pattern generated by the first and second split beam pulses 211, 221 irradiates a neighboring section of the silicon thin film provided on the sample 260, which is provided at an offset and –45° from the re-solidified areas of the section 82.

Figure 6A:
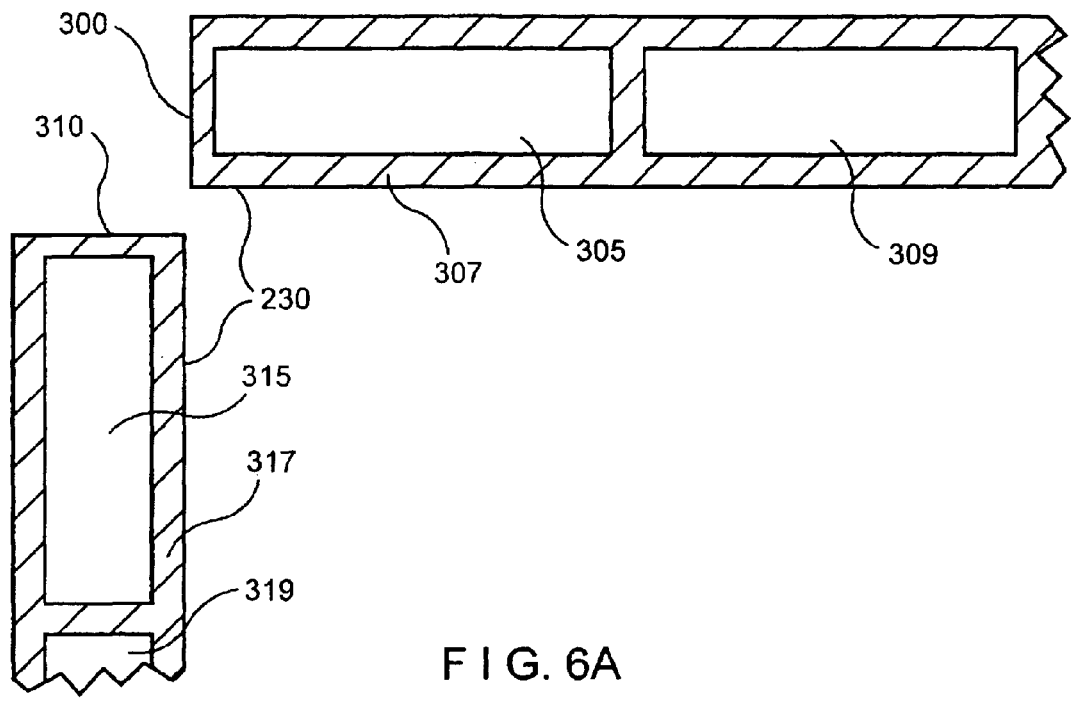
FIGS. 6A–6D are illustrations of a radiation beam pulse intensity pattern and the grain structure of exemplary sections of a film sample at different stages of the LS processing in accordance with a third exemplary embodiment of the process of the present invention.

A third exemplary embodiment of the process according to the present invention shall now be described with reference to FIGS. 6A–6D. In this exemplary embodiment of the process, as shown in FIG. 6A, the mask 230 includes at least two sets of slits 300, 310 which have respective opaque regions 307, 317 surrounding corresponding transparent regions 305, 309 and 315, 319 of the mask 230. The mask 230 used in this exemplary embodiment of the process according to the present invention does not have any opaque regions inside the transparent regions 305, 309, 315, 319. Accordingly, with the use of the slits 300, 310, the second split beam pulse 221 is shaped to have the irradiation pattern substantially corresponding to the pattern of the slits 300, 310 of the mask 230.

Figure 6B:
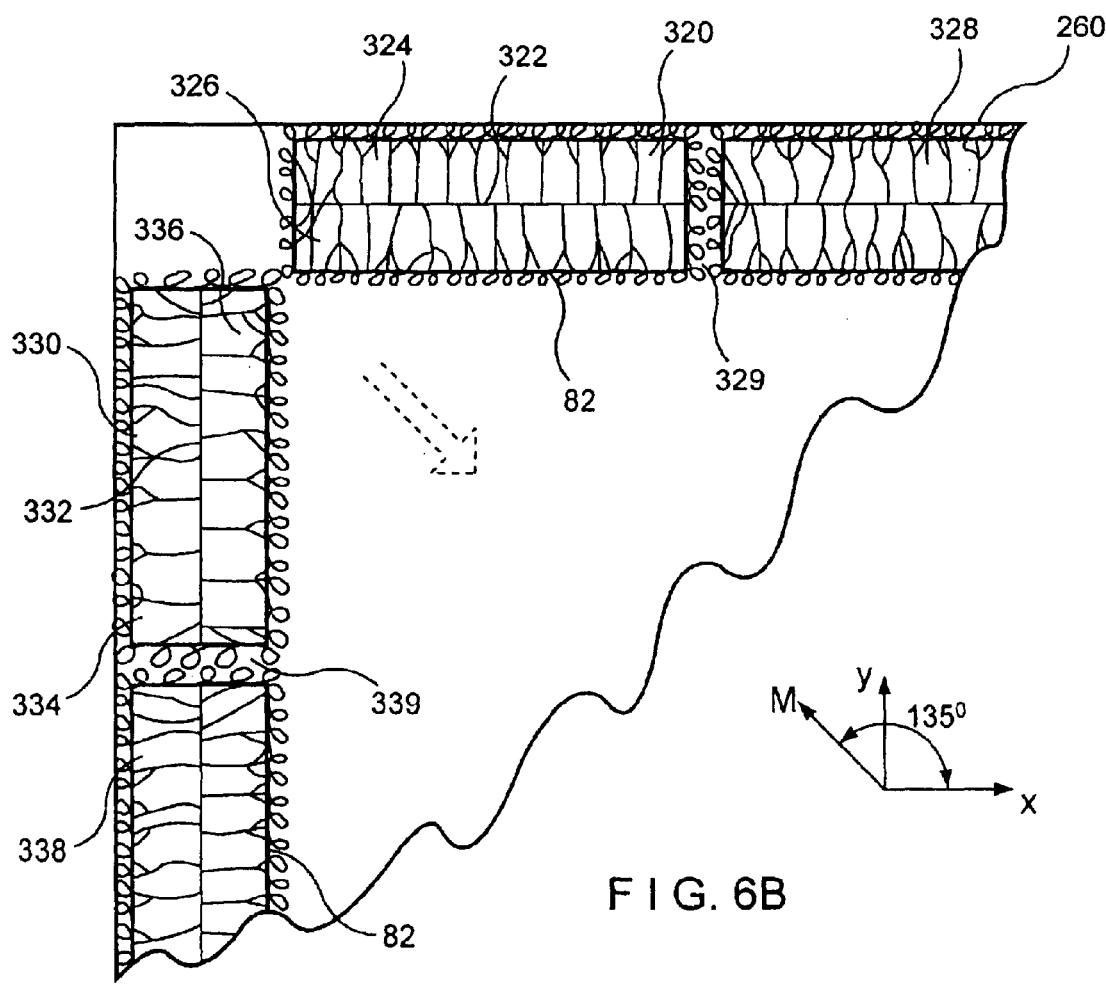

Turning now to FIG. 6B, the same configuration of the section 82 of the silicon thin film provided on the sample 260 used to describe the first and second exemplary embodiments of the process (as illustrated in FIGS. 4A–4I and 5A–5E, respectively) is used herein to describe the present embodiment of the process according to the present invention. As in the first and second exemplary embodiment of the process, the section 82 initially has small grains and grain boundaries that are oriented in random directions. Initially, areas 320, 328, 330, 338 of the section 82 of the silicon thin film are irradiated by a first set of the first and second split beam pulses 211, 221 having an intensity pattern as defined by the exemplary embodiment of the mask 230 shown in FIG. 6A. In particular, the areas 320, 328 are irradiated by the portion of the intensity pattern of the second split beam pulses 221 which are shaped by the slits 305, 309 of the mask 230, and the areas 330, 338 are irradiated by the portion of the intensity pattern of the second split beam pulses 221 which are shaped by the slits 315, 319 of the mask 230. Since the oblique regions of the mask 230 prevent the second split beam pulses 221 from irradiating the areas 329, 339 of the section 82 which are immediately adjacent to the areas 320, 328, 330, 338, these areas 329, 339 are at least partially unmelted. After the irradiation by the first set of the first and second split beam pulses 211, 221, the areas 320, 328, 330, 338 are melted throughout their entire thickness.

Thereafter, the at least partially unmelted areas 329, 339 of the section 82 of the silicon thin film re-solidify and crystallize to form nucleated areas corresponding to the at least partially unmelted areas 329, 339. Also, after the irradiation thereof by the first set of the first and second split beam pulses 211, 221, the melted areas 320, 328, 330, 338 in the section 82 cool and re-solidify, and the lateral growth of the grains occurs outwardly from the nucleated areas 329, 339 toward respective centers 322, 332 of the completely melted and resolifying areas 320, 328, 330, 338. In this manner, the re-solidification areas 320, 328, 330, 338 are formed in the section 82 with each one of the re-solidification areas 320, 328 and 330, 338 having two respective rows 322, 324 and 332, 334 of larger crystal grains.

After the completion of the re-solidification of the melted areas 320, 328 and 330, 338 in the section 82, and following the irradiation by the first set of the first and second split beam pulses 211, 221, the sample 260 is translated in the M direction at 135° with respect to the X axis, or the mask 230 (shown in FIG. 2) may be microstranslated in the –M direction at –45° with respect to the X axis, so as to cause the intensity pattern of a second set of the first and second split beam pulses 211, 221 to be shifted to overlap at least one entire row 324, 334 of the re-solidified areas 320, 328 and 330, 338 in the section 82 (e.g., preferably to overlap the respective centers 322, 332 thereof). It should be understood by those skilled in the art that either the sample 260, the mask 230 or both may be translated to cause the intensity pattern of the second set of the first and second split beam pulses 211, 221 to slightly overlap at least one row 324, 334. It should be understood that the intensity pattern of the second set of the first and second split beam pulses 211, 221 is the same as that of the first set of the first and second split beam pulses 211, 221. It is also within the scope of the present invention for the intensity pattern of a second set of the first and second split beam pulses 211, 221 to slightly overlap a small section of at least one row 324, 334 of the re-solidified areas 320, 328 and 330, 338 in the section 82.

After the translation of the sample 260 or the mask 230 (or both), new areas 340, 342, 350, 352 of the section 82 (which are overlapped by the relatively translated first and second split beam pulse 211, 221) are irradiated by the irradiation pattern of the second set of the first and second split beam pulses 211, 221. As with the areas 320, 328, 330, 338, the new areas 340, 342, 344, 346 of the section of the silicon thin film are completely melted throughout their thickness.

Figure 6C:
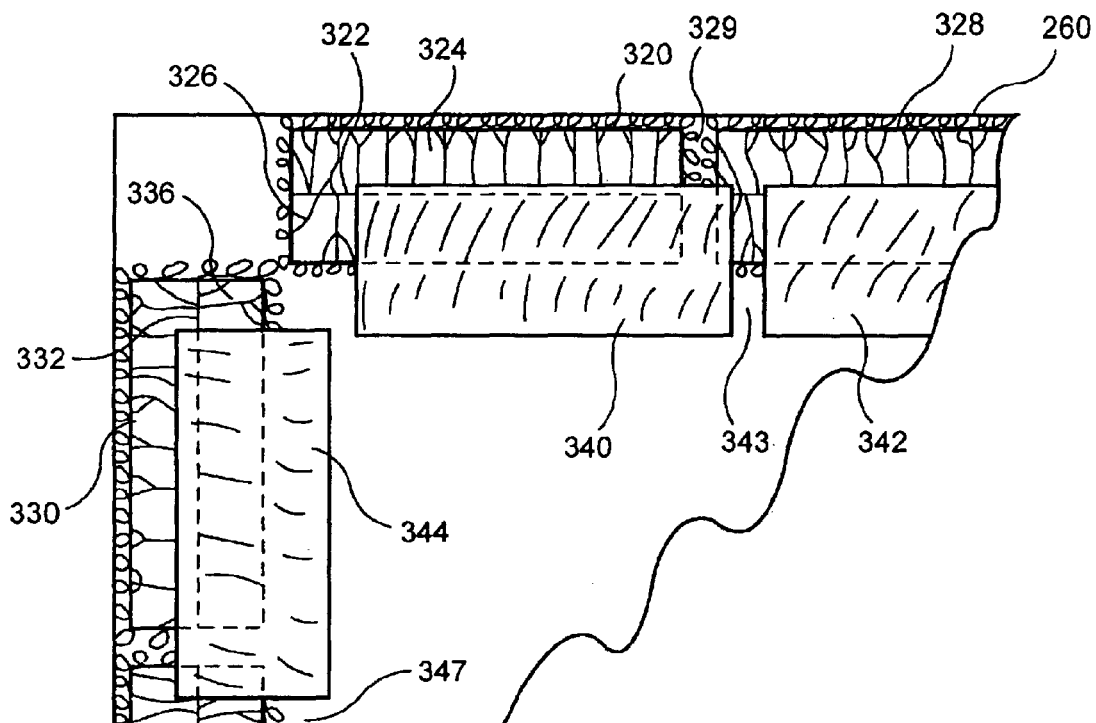

As discussed previously, due to the fact that the oblique regions of the mask 230 prevent the second split beam pulses 221 from irradiating the areas 343, 347 of the section 82 which are immediately adjacent to the areas 340, 342 and 344, 346, respectively, these adjacent areas 343, 347 are at least partially unmelted. FIG. 6C shows the sample 260 when the completely melted areas 340, 342, 344, 346 have re-solidified after being irradiated by the first and second split beam pulses 211, 221. Also shown are the areas 343, 347 which were partially melted.

Figure 6D:
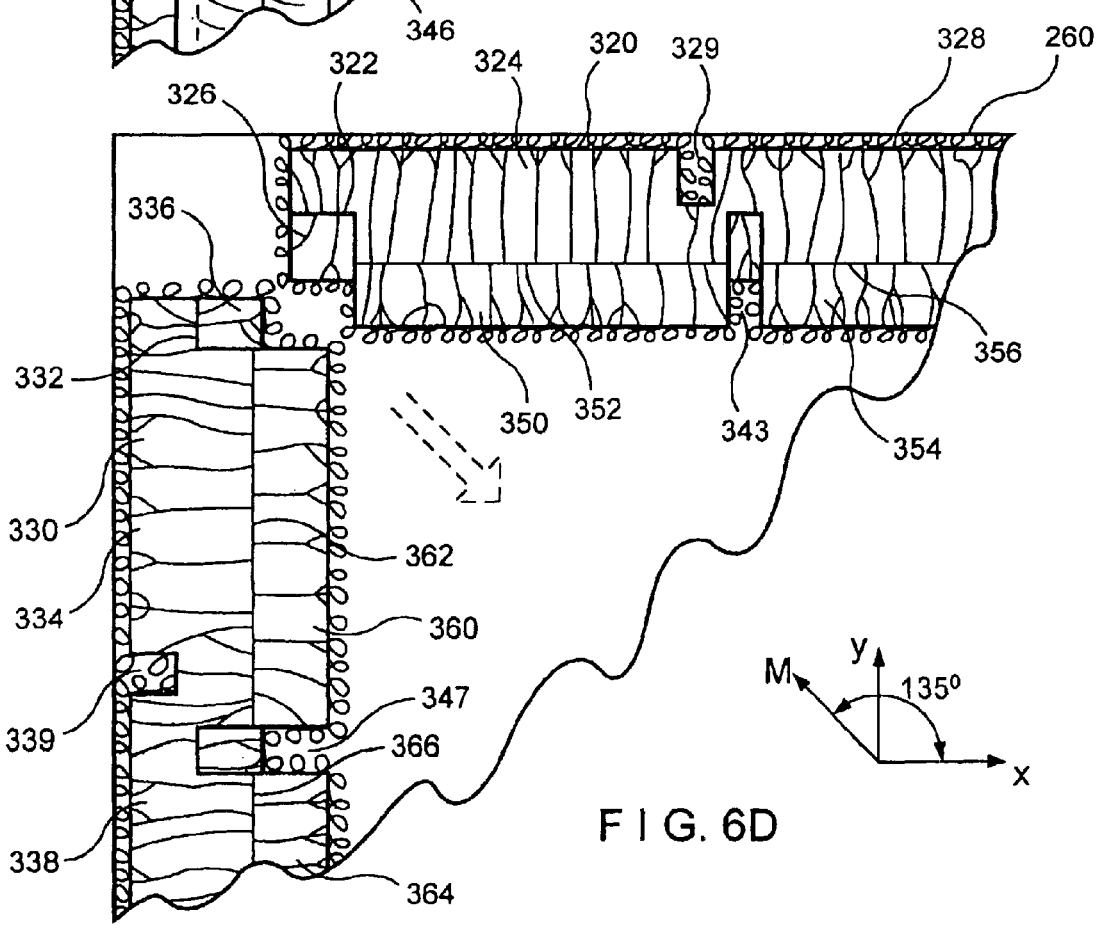

As shown in FIG. 6D, upon the re-solidification of the fully melted areas 340, 342, 344, 346 in the section 82, the areas 343, 347 re-solidify and nucleate such that the grains of the nucleated areas 343, 347 will seed the growth of the grains of the melted areas 340, 342, 344, 346 laterally toward the respective centers of these areas 340, 342, 344, 346. At the same time, the grains of the solidified and not re-melted portions of the areas 320, 328, 330, 338 will also seed the grain growth of the areas 340, 342, 344, 346 laterally toward the respective centers of these areas 340, 342, 344, 346. In this manner, the grains extending from the solidified and not re-melted portions of the areas 320, 328, 330, 338 will extend into the newly solidifying areas 340, 342, 344, 346 so as to form long crystalline grains which extend up to the respective centers 352, 356 and 362, 366 of the re-solidified areas of the section 82 of the silicon thin film which correspond to the melted areas 340, 342 and 344, 346, respectively. Therefore, the grains in the rows 324, 334 will be longer than the grains in rows 350, 354, 360, 364.

In this manner, the LS processing of the section 82 to obtain a desired long crystalline grain structure in the section 82 of the silicon thin film as described above with reference to FIGS. 6A–6D can be achieved. It should be understood that the translation of the sample 260 in the +M direction or the mask 230 in the −M direction may continue until the entire sample has been irradiated in the manner described above with reference to the third exemplary embodiment of the process according to the present invention.

Figure 7:
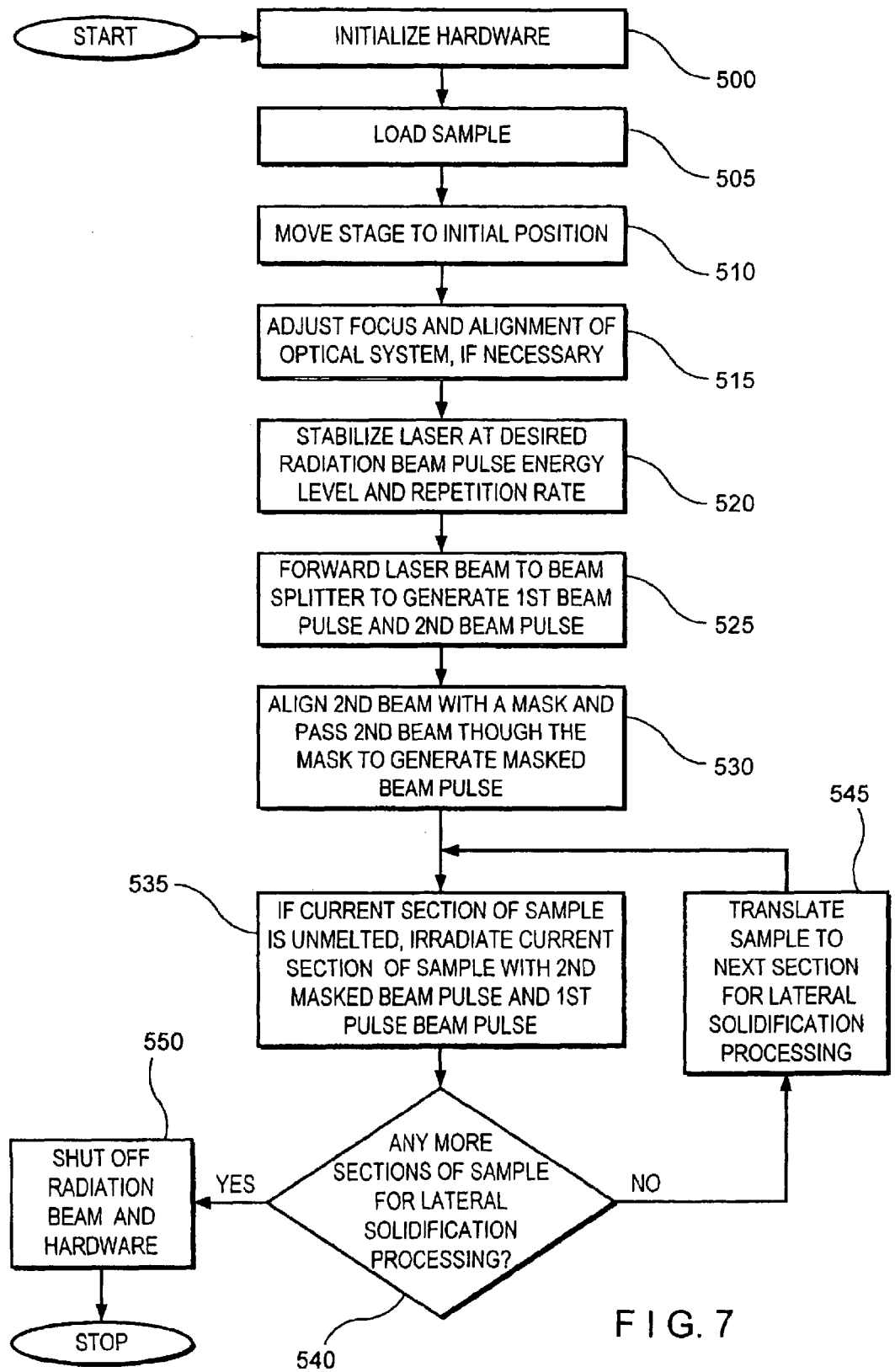
FIG. 7 is a flow diagram representing an exemplary LS processing procedure under at least partial control of a computing arrangement of FIG. 2 using the processes of the present invention of FIGS. 4A–4I, 5A–5E and 6A–6D, as may be carried out by the system of FIG. 2.

FIG. 7 is a flow diagram representing an exemplary LS processing procedure under at least partial computer control using the processes of the present invention of FIGS. 4A–4I, 5A–5E and 6A–6D, as may be carried out by the system of FIG. 2. In step 500, the hardware components of the system of FIG. 2, such as the beam source 200 and the homogenizer 213, are first initialized at least in part by the computing arrangement 270. The sample 260 is loaded onto the sample translation stage 250 in step 505. It should be noted that such loading may be performed either manually or automatically using known sample loading apparatus under the control of the computing arrangement 270. Next, the sample translation stage 250 is moved, preferably under the control of the computing arrangement 270, to an initial position in step 510. Various other optical components of the system are adjusted manually or under the control of the computing arrangement 270 for a proper focus and alignment in step 515, if necessary. In step 520, the irradiation/laser beam 201 is stabilized at a predetermined pulse energy level, pulse duration and repetition rate. Then, the irradiation/laser beam 201 is directed to the beam splitter 210 to generate the first split beam pulse 211 and the second split beam pulse 221 in step 525. In step 530, the second split beam 221 is aligned with the mask 230, and the second split beam pulse 221 is irradiated through the mask 230 to form a masked beam pulse 225.

In step 535, if the current section of the sample 260 is unmelted or has already solidified, this current section of the sample 260 is irradiated with the first split beam pulse 211 and the masked beam pulse 225 which has an intensity pattern controlled by the mask 230. During this step, the sample 260 can be microtranslated as described above with reference to the processes illustrated in FIGS. 4A–4I and 5A–5E, and the corresponding sections again irradiated and melted throughout their entire thickness. In step 540, it is determined whether there are any more sections of the sample 260 that need to be subjected to the LS processing. If so, the sample 260 is translated using the sample translation stage 250 so that the next section thereof is aligned with the first and second split beam pulses 211, 221 (step 545), and the LS processing is returned to step 535 to be performed on the next section of the sample 260. Otherwise, the LS processing has been completed for the sample 260, the hardware components and the beam of the system shown in Figure can be shut off (step 550), and the process terminates.

The foregoing merely illustrates the principles of the invention. Various modifications and alterations to the described embodiments will be apparent to those skilled in the art in view of the teachings herein. For example, while the above embodiment has been described with respect to sequential lateral solidification, it may apply to other materials processing techniques, such as micro-machining, photo-ablation, and micro-patterning techniques, including those described in International patent application no. PCT/US01/12799 and U.S. patent application Ser. Nos. 09/390, 535, 09/390,537 and 09/526,585, the entire disclosures of which are incorporated herein by reference. The various mask patterns and intensity beam patterns described in the above-referenced patent application can also be utilized with the process and system of the present invention. It will thus be appreciated that those skilled in the art will be able to devise numerous systems and methods which, although not explicitly shown or described herein, embody the principles of the invention and are thus within the spirit and scope of the invention.

What is claimed is:

1. A process for processing a silicon thin film on a sample, comprising the steps of:
   (a) controlling an irradiation beam generator to emit irradiation beam pulses at a predetermined repetition rate;
   (b) separating file irradiation beam pulses into a first set of separated beam pulses and a second set of separated beam pulses;
   (c) forwarding the first set of separated beam pulses to irradiate and pass at least portions thereof through a mask to produce a plurality of beamlets; and
   (d) providing the second set of separated beam pulses and the beamlets to impinge and irradiate at least one section of the silicon thin film, wherein, when the second set of separated beam pulses and the beamlets simultaneously irradiate the at least one section of the silicon thin film, the second set of the separated beam pulses and the beamlets provide a combined intensity which is sufficient to melt the at least one irradiated section of the silicon thin film throughout an entire thickness of the section.

2. The process according to claim 1, wherein the first set of separated beam pulses has a corresponding intensity which is lower than an intensity required to damage or degrade the mask.

3. The process according to claim 1, wherein step (c) includes the substep of preventing the second set of separated beam pulses from being forwarded to the mask.

4. The process according to claim 3, wherein the preventing substep is performed by diverting the second set of separated beam pulses away from the mask prior to the second set of separated beam pulses reaching the mask.

5. The process according to claim 1, wherein the second set of separated beam pulses has a corresponding intensity which is lower than an intensity required to melt the at least one section of the silicon thin film throughout the entire thickness thereof.

6. The process according to claim 1, wherein, during step (d), the at least one irradiated and melted section of the silicon thin film is allowed to re-solidify and crystallize.

7. The process to claim 6, further comprising the step of:
(e) after step (d) and after the section of the silicon thin film re-solidifies and crystallizes, translating the sample so that the beamlets and the second set of separated beam pulses impinge a further section of the silicon thin film, wherein the further section at least partially overlaps the section that was allowed to re-solidify and crystallize.

8. The process according to claim 7, further comprising the step of:
(f) after step (d) and before step (e), microtranslating the sample so that the beamlets and the second set of separated beam pulses impinge at least one previously irradiated, fully melted, re-solidified and crystallized portion of the section of the silicon thin film.

9. The process to claim 8, wherein the beamlets and the second set of separated beam pulses irradiate and fully melt the section of the silicon thin film from a microtranslated location of impingement on the sample.

10. The process according to claim 8, wherein the mask has a dot-like pattern such that dot portions of the pattern are oblique regions of the mask which prevent certain portions of the first set of separated beam pulses to irradiate there through.

11. The process according to claim 8, wherein the mask has a line pattern such that line portions of the pattern are oblique regions of the mask which prevent certain portions of the first set of separated beam pulses to irradiate there through.

12. The process according to claim 7, wherein the mask has a transparent pattern such that transparent portions of the pattern do not include oblique regions therein, the oblique regions capable of preventing certain portions of the first set of separated beam pulses to irradiate there through.

13. A process for processing a silicon thin film on a sample, comprising the steps of:
(a) controlling an irradiation beam generator arrangement to provide first and second sets of irradiation beam pulses at a predetermined repetition rate;
(b) forwarding the first set of beam pulses to irradiate and pass at least a portion thereof through a mask to produce a plurality of beamlets; and
(c) providing the second set of beam pulses and the beamlets to impinge and irradiate at least one section of the silicon thin film, wherein, when the second set of beam pulses and the beamlets simultaneously irradiate the at least one section of the silicon thin film, the second set of beam pulses and the beamlets provide a combined intensity which is sufficient to melt the at least one irradiated section of the silicon thin film throughout an entire thickness of the section.

14. The process according to claim 13, wherein a step (a) includes the substeps of:
i. emitting irradiation beam pulses at a predetermined repetition rate, and
ii. separating the irradiation beam pulses into the first set of beam pulses and the second set of beam pulses.

15. The process according to claim 14, wherein substep (ii) is performed prior to the irradiation beam pulses reaching the mask.

16. The process according to claim 13, wherein the first set of beam pulses has a corresponding intensity which is lower than an intensity required to damage or degrade the mask.

17. The process according to claim 13, wherein step (b) includes the substep of preventing the second set of beam pulses from being forwarded to the mask.

18. The process according to claim 16, wherein th preventing substep is performed by diverting the second set of beam pulse away from the mask prior to the second act of beam pulses reaching the mask.

19. The process according to claim 13, wherein the second act of beam pulses has a corresponding intensity which is lower than an intensity required to melt the at least one section of the silicon thin film throughout the entire thickness thereof.

20. The process according to claim 13, wherein, during step (c), the at least one irradiated and melted section of the silicon thin film is allowed to re-solidify and crystallize.

21. The process according to claim 20, further comprising the step of:
(d) after step (c) and after the section of the silicon thin film re-solidifies and crystallizes, translating the sample so that the beamlets and the second set of beams pulses impinge a further section of the silicon thin film, wherein the further section at least partially overlaps the section that was allowed to re-solidify and crystallize.

22. The process according to claim 21, further comprising the step of
(e) after step (c) and before step (d), microtranslating the sample so that the beamlets and the second act of beam, pulses impinge at least one previously irradiated, fully melted, re-solidified and crystallized portion of the section of the silicon thin film.

23. The process according to claim 22, wherein the beamlets and the second set of beams pulses irradiate and fully melt the section of the silicon thin film from a microtranslated location of impingement on the sample.

24. The process according to claim 22, wherein the mask has a dot-like pattern such that dot portions of the pattern oblique regions of the mask which prevent certain portions of the first set of beam pulses to irradiate there through.

25. The process according to claim 22, wherein the mask has a line pattern such that line portions of the pattern are oblique regions of the mask which prevent certain portions of the fist set of beam pulses to irradiate there through.

26. The process according to claim 21, wherein the mask has a transparent pattern such that transparent portions of the pattern do not include oblique region therein, the oblique regions capable of preventing certain portions of the first set of beam pulses to irradiate there through.

27. A system for processing a silicon thin film on a sample, comprising:
a memory storing a computer program; and
processing arrangement executing the computer program to perform the following step:
(a) controlling an irradiation beam generator to emit irradiation beam pulses at a predetermined repetition rate,
(b) causing the irradiation beam pulses to be separated into a first set of separated beam pulses and a second set of separated beam pulses,
(c) forwarding the first set of separated beam pulses to irradiate and pass at least portions thereof through a mask to produce a plurality of beamlets, and
(d) causing the second set of separated beam pulses and the beamlets to impinge and irradiate at least one section of the silicon thin film,
wherein, when the second set of separated beam pulses and the beamlets both simultaneously irradiate the at least one section of the silicon thin film, the second set of separated beam pulses and beamlets provide a combined intensity which is sufficient to melt the at least one irradiated section of the silicon thin film throughout an entire thickness of the section.

28. The system according to claim 27, further comprising a beam splitter arranged in a vicinity of the processing arrangement, wherein the processing arrangement causes the irradiation beam pulses to be forwarded to the beam splitter which separates the irradiation beam pulses into the first set of separated beam pulses and the second set of separated beam pulses.

29. The system according to claim 28, wherein the beam splitter is located upstream in a path of the irradiation beam pulses from the mask.

30. The system according to claim 27, wherein the first set of separated beam pulses has a corresponding intensity which is lower than an intensity required to damage or degrade the mask.

31. The system according to claim 27, wherein the processing arrangement executes the computer program to prevent the second set of separated beam pulses from being forwarded to the mask.

32. The system according to claim 31, wherein the second set of separated beam pulses from being forwarded to the mask by diverting the second set of separated beam pulses away from the mask prior to the second set of separated beam pulses reaching the mask.

33. The system according to claim 27, wherein the second set of separated beam pulses has corresponding intensity which is lower than an intensity required to melt the at least one section of the silicon thin film throughout the entire thickness thereof.

34. The system according to claim 27, wherein, when at least one section of the silicon thin film is irradiated, the at least one irradiated and melted section of the silicon thin film is allowed to re-solidify and crystallize.

35. The system according to claim 34, wherein the processing arrangement executes the computer program to perform the following further step:
(e) after substep (d) and after the section of the silicon thin film re-solidifies and crystallizes, causing a translation of the sample so that the beamlets and the second set of separated beam pulses impinge a further section of the silicon thin film, wherein the further section at least partially overlaps the section that was allowed to re-solidify and crystallize.

36. The system according to claim 35, wherein the processing arrangement executes the computer program to perform the following further step:
(f) after substep (d) and before substep (e), causing a microtranslation of the sample so that the beamlets and the second set of separated beam pulses impinge at least one previously irradiated, fully melted, re-solidified and crystallized portion of the section of the silicon thin film.

37. The system according to claim 36, wherein the beamlets and the second set of separated beam pulses irradiate and fully melt the section of the silicon thin film from a microtranslated location of impingement of the sample.

38. The system according to claim 36, wherein the mask has a dot-like pattern such that dot portions of the pattern are oblique regions of the mask which prevent certain portions of the first set of separated beam pulses to irradiate there through.

39. The system according to claim 36, wherein the mask has a line pattern such that line portions of the pattern are oblique regions of the mask which prevent certain portions of the first set of separated beam pulses to irradiate there through.

40. The system according to claim 35, wherein the mask has a transparent pattern such that transparent portions of the pattern do not include oblique regions therein, the oblique regions capable of preventing certain portions the first set of separated beam pulses to irradiate there through.

41. A system for processing a silicon thin film on a sample, comprising:
a memory storing a computer program; and
a processing arrangement executing the computer program to perform the following steps:
(a) controlling an irradiation beam generator arrangement to provide first and second sets of irradiation beam pulses at a predetermined repetition rate,
(b) causing the first set of beam pulses to be irradiated and pass at least a portion thereof through a mask to produce a plurality of beamlets, and
(c) causing the second set of beam pulses and the beamlets to impinge and irradiate at least one section of the silicon thin film,
wherein, when the second set of beam pulses and the beamlets simultaneously irradiate the at least one section of the silicon thin film, the second set of beam pulses and the beamlets provide a combined intensity which is sufficient to melt the at least one irradiated section of the silicon thin film, throughout an entire thickness of the section.

42. The system according to claim 41, wherein the processing arrangement causes the irradiation beam generator arrangement to emit irradiation beam pulses at a predetermined repetition rate.

43. The system according to claim 41, further comprising a beam splitter arranged in a vicinity of the processing arrangement, wherein the processing arrangement causes the irradiation beam pulses to be forwarded to the beam splitter which separates the irradiation beam pulses into the first set of beam pulses and the second set of beam pulses.

44. The system according to claim 41, wherein the beam splitter is located upstream in a path of the irradiation beam pulses from the mask.

45. The system according to claim 43, wherein the beam splitter separates the irradiation beam pulses into the first set of beam pulses and the second set of beam pulses prior to the irradiation beam pulses reaching the mask.

46. The system according to claim 41, wherein the first set of beam pulses has a corresponding intensity which is lower than as intensity required to damage or degrade to the mask.

47. The system according to claim 41, wherein the processing arrangement executes the computer program to prevent the second set of beam pulses from being forwarded to the mask.

48. The system according to claim 47, wherein the second set of beam pulses from being forwarded to the mask by diverting the second set of beam away from the mask prior to the second set of beam pulses reaching the mask.

49. The system according to claim 41, wherein the second set of beam pulses has a corresponding intensity which is lower than an intensity required to melt the at least one section of the silicon thin film throughout the entire thickness thereof.

50. The system according to claim 41, wherein, when at least one section of the silicon thin film is irradiated, the at least one irradiated and melted section of the silicon thin film is allowed to re-solidify and crystallize.

51. The system according to claim 50, wherein the processing arrangement executes the computer program to perform the following further step:
(d) after substep (c) and after the section of the silicon thin film re-solidifies and crystallizes, causing a translation of the sample so that the beamlets and the second set of beam pulses impinge a further section of the silicon thin film, wherein the further section at least partially overlaps the section that was allowed to re-solidify and crystallize.

52. The system according to claim 51, wherein the processing arrangement executes the computer program to perform the following further step:
(e) after substep (c) and before substep (d), causing a microtranslation of the sample so that the beamlets and the second set of beam pulses impinge at least one previously irradiated, fully melted, re-solidified and crystallized portion of the section of the silicon thin film.

53. The system according to claim 52, wherein the beamlets and the second set of beam pulses irradiate and fully melt the section of the silicon thin film from a microtranslated location of the sample.

54. The system according to claim 52, wherein the mask has a dot-like pattern such that dot portions of the pattern a oblique regions of the mask which prevent certain portions of the first set of beam pulses to irradiate there through.

55. The system according to claim 52, wherein the mask has a line pattern such that line portions of the pattern are oblique regions of the mask which prevent certain portions of the first set of beam pulse to irradiate there through.

56. The system according to claim 51, wherein the mask has a transparent pattern such that transparent portions of the pattern do not include oblique regions therein, the oblique regions capable of preventing certain portions of the first set of beam pulses to irradiate there through.

57. A system for processing a silicon thin film on a sample, comprising:
a processing arrangement programmed to control an irradiation beam generator to emit irradiation beam pulses at a predetermined repetition rate;
a beam separation arrangement which, when receiving the irradiation beam pulses, separates the irradiation beam into a first set of beam pulses and a second set of beam pulses; and
a mask configured to receive thereon the first set of beam pulses, and produce a plurality of beamlets.
wherein tho processing arrangement is further programmed to position the sample with respect to a direction of the irradiation beam pulses such that the second set of beam pulses and the beamlets impinge an irradiate at least one section of the thin film, and
wherein, when the second set of beam pulses and the beamlets both simultaneously irradiate the at least one section of the thin film, the second set of beam pulses and beamlets provide a combined intensity which is sufficient to melt the at least one irradiated section of the silicon thin film throughout an entire thickness of the section.

58. An arrangement for processing a silicon thin film on a sample, comprising:
a processing arrangement programmed to control an irradiation beam generator to emit irradiation beam pulses at a predetermined repetition rate;
a beam separation arrangement which, when receiving the irradiation beam pulses, separates the irradiation beam into at least one first pulse and at least one second pulse; and
a mask configured to receive thereon the at least one first pulse, and produce a plurality of beamlets,
wherein the processing arrangement is further programmed to position the sample with respect to a direction of the irradiation beam pulses such that the at least one second pulse and the beamlets impinge and irradiate at least one section of the thin film, and
wherein, when the at least one second pulse and the beamlets both simultaneously irradiate the at least one section of the thin film, the at least one second pulse and beamlets provide a combined intensity which is sufficient to melt the at least
(b) causing the irradiation beam pulses to be separated into a first set of separated beam pulses and a second set of separated beam pulses,
(c) forwarding the first set of separated beam pulses to irradiate and pass at least portions thereof through a mask to produce a plurality of beamlets, and
(d) causing the second set of separated beam pulses and the beamlets to impinge and irradiate at least one section of the silicon thin film,
wherein, when the second set of separated beam pulses and the beamlets both simultaneously irradiate the at least on section of the silicon thin film, the second set of separated beam pulses and beamlets provide a combined intensity which is sufficient to melt the at least one irradiated section of the silicon thin film throughout an entire thickness of the section.

* * * * *